United States Patent
Gwon et al.

(10) Patent No.: US 11,462,537 B2
(45) Date of Patent: Oct. 4, 2022

(54) SEMICONDUCTOR DEVICE

(71) Applicant: SAMSUNG ELECTRONICS CO., LTD., Suwon-si (KR)

(72) Inventors: Yeong Han Gwon, Suwon-si (KR); Soo Yeon Jeong, Osan-si (KR); Geum Jong Bae, Suwon-si (KR); Dong Il Bae, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/919,300

(22) Filed: Jul. 2, 2020

(65) Prior Publication Data

US 2021/0035976 A1 Feb. 4, 2021

(30) Foreign Application Priority Data

Jul. 29, 2019 (KR) ........................ 10-2019-0091487

(51) Int. Cl.
| | | |
|---|---|---|
| *H01L 27/092* | (2006.01) | |
| *H01L 23/535* | (2006.01) | |
| *H01L 29/423* | (2006.01) | |
| *H01L 29/786* | (2006.01) | |
| *H01L 27/088* | (2006.01) | |
| *H01L 29/78* | (2006.01) | |

(52) U.S. Cl.
CPC ........ *H01L 27/0924* (2013.01); *H01L 23/535* (2013.01); *H01L 29/42392* (2013.01)

(58) Field of Classification Search
CPC ............. H01L 27/0924; H01L 27/0886; H01L 29/42392; H01L 29/78696; H01L 29/785; H01L 29/7855; H01L 23/535; H01L 21/76232
See application file for complete search history.

(56) References Cited

U.S. PATENT DOCUMENTS

| | | |
|---|---|---|
| 9,780,200 B2 | 10/2017 | Zhu |
| 9,793,273 B2 | 10/2017 | Liaw |
| 10,090,382 B1 | 10/2018 | Yu et al. |
| 10,141,312 B2 | 11/2018 | Jeon et al. |
| 10,157,800 B2 | 12/2018 | Chang et al. |
| 10,312,350 B1* | 6/2019 | Cheng ............... H01L 21/02603 |
| 2017/0365604 A1* | 12/2017 | Suh .................. H01L 21/823814 |
| 2018/0090491 A1 | 3/2018 | Huang et al. |
| 2018/0261596 A1 | 9/2018 | Jun et al. |
| 2018/0315839 A1 | 11/2018 | Zhou |

(Continued)

*Primary Examiner* — Herve-Louis Y Assouman
(74) *Attorney, Agent, or Firm* — Lee IP Law, P.C.

(57) ABSTRACT

A semiconductor device includes a substrate, a first lower pattern and a second lower pattern on the substrate and arranged in a line in a first direction, a first active pattern stack disposed on and spaced apart from the first lower pattern, a second active pattern stack disposed on and spaced apart from the first lower pattern, a fin-cut gate structure disposed on the first lower pattern and overlapping a portion of the first lower pattern, a first gate structure surrounding the first active pattern stack and extending in a second direction crossing the first direction, a second gate structure surrounding the second active pattern stack and extending in the second direction, and a device isolation layer between the first gate structure and the second gate structure and separating the first lower pattern and the second lower pattern.

20 Claims, 20 Drawing Sheets

(56) References Cited

U.S. PATENT DOCUMENTS

| | | |
|---|---|---|
| 2018/0366329 A1 | 12/2018 | Kim |
| 2019/0013314 A1 | 1/2019 | Choi et al. |
| 2019/0165118 A1* | 5/2019 | Leobandung ....... H01L 29/0847 |
| 2019/0214459 A1* | 7/2019 | Cheng ............... H01L 21/02603 |

* cited by examiner

SEMICONDUCTOR DEVICE

CROSS-REFERENCE TO RELATED APPLICATION

Korean Patent Application No. 10-2019-0091487, filed on Jul. 29, 2019, in the Korean Intellectual Property Office, and entitled: "Semiconductor Device," is incorporated by reference herein in its entirety.

BACKGROUND

1. Field

Embodiments relate to a semiconductor device.

2. Description of the Related Art

As a semiconductor device becomes more highly integrated, it becomes more difficult to implement a transistor performance required by a user. As such, various field effect transistors have been proposed. For example, a high dielectric layer-metal gate structure has been proposed instead of a general field effect transistor including a gate insulation layer and a gate electrode formed using silicon oxide and polysilicon, respectively.

As a feature size of the field effect transistor is reduced, a length of a gate and a length of a channel thereunder become small. Thus, a manufacturing process and structure of an integrated circuit device are variously studied to improve an operation stability and reliability of transistors, which are factors for determining a performance of the integrated circuits.

SUMMARY

Embodiments are directed to a semiconductor device, including a substrate, a first lower pattern and a second lower pattern on the substrate and arranged in a line in a first direction, a first active pattern stack disposed on and spaced apart from the first lower pattern, a second active pattern stack disposed on and spaced apart from the first lower pattern, a fin-cut gate structure disposed on the first lower pattern and overlapping a portion of the first lower pattern, a first gate structure surrounding the first active pattern stack and extending in a second direction crossing the first direction, a second gate structure surrounding the second active pattern stack and extending in the second direction, and a device isolation layer between the first gate structure and the second gate structure and separating the first lower pattern and the second lower pattern.

Embodiments are also directed to a semiconductor device, including a substrate, a lower pattern disposed on the substrate and extending in a first direction parallel to an upper surface of the substrate, a plurality of sheet patterns disposed on the lower pattern and arranged in a second direction that is perpendicular to the upper surface of the substrate, a gate electrode surrounding the plurality of sheet patterns, and an insulation pattern contacting the plurality of sheet patterns and including a linear insulation pattern and a plurality of protruding insulation patterns. The linear insulation pattern may extend in the second direction, and each of the plurality of protruding insulation patterns may protrudes in the first direction from a sidewall of the linear insulation pattern.

Embodiments are also directed to a semiconductor device, including a substrate including a first region and a second region, a first lower pattern in the first region and extending in a first direction, a second lower pattern in the second region and extending in a second direction, a first active pattern stack on the first lower pattern, the first active pattern stack including a plurality of first sheet patterns, a second active pattern stack on the second lower pattern, the second active pattern stack including a plurality of second sheet patterns, a first gate structure surrounding the plurality of first sheet patterns, a second gate structure surrounding the plurality of second sheet patterns, a first device isolation layer extending along a sidewall of the first gate structure and contacting the first lower pattern, and a second device isolation layer extending along a sidewall of the second gate structure and contacting the second lower pattern. The first device isolation layer may include a first portion between an upper surface of the first lower pattern and an uppermost surface of the first active pattern stack, the second device isolation layer may include a second portion between an upper surface of the second lower pattern and the uppermost surface of the second active pattern, the first portion of the first device isolation layer may have a first width in the first direction, and the second portion of the second device isolation layer may have a second width in the second direction greater than the first width.

BRIEF DESCRIPTION OF THE DRAWINGS

Features will become apparent to those of skill in the art by describing in detail example embodiments with reference to the attached drawings in which.

DETAILED DESCRIPTION

Figure 1:
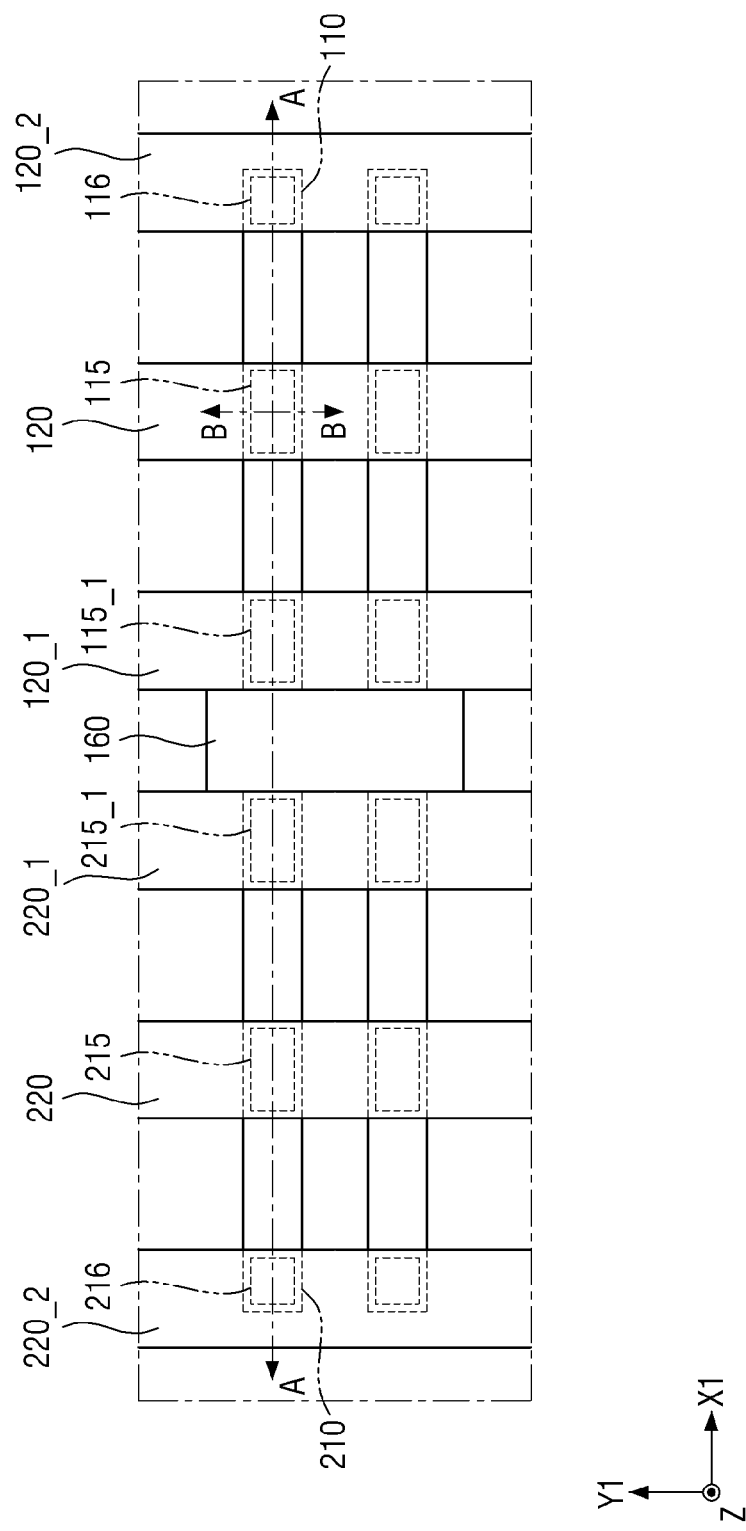
FIG. 1 illustrates a plan view of a semiconductor device according to an example embodiment.
Figure 2:
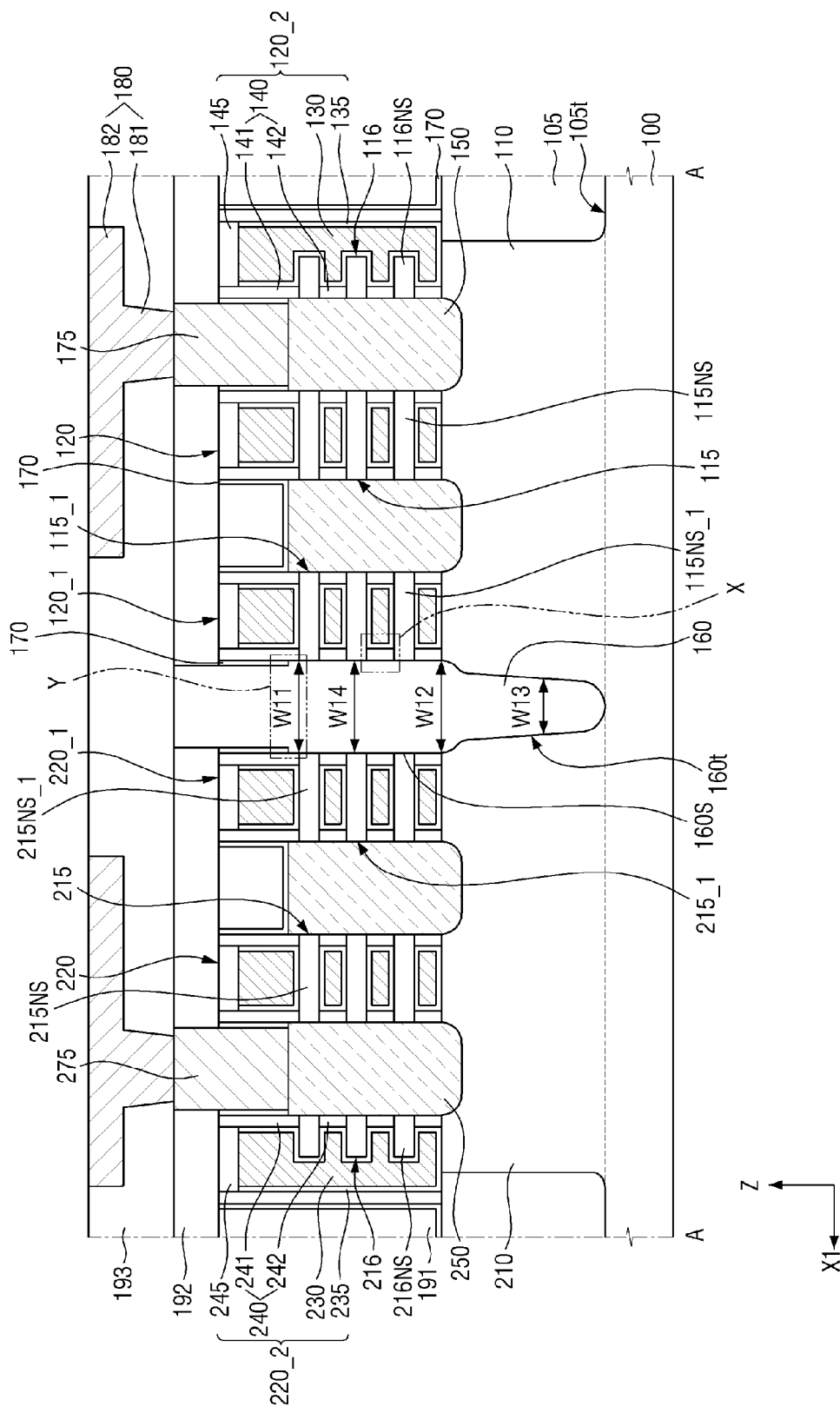
FIG. 2 illustrates a cross-sectional view taken along line A-A of FIG. 1.
Figure 3:
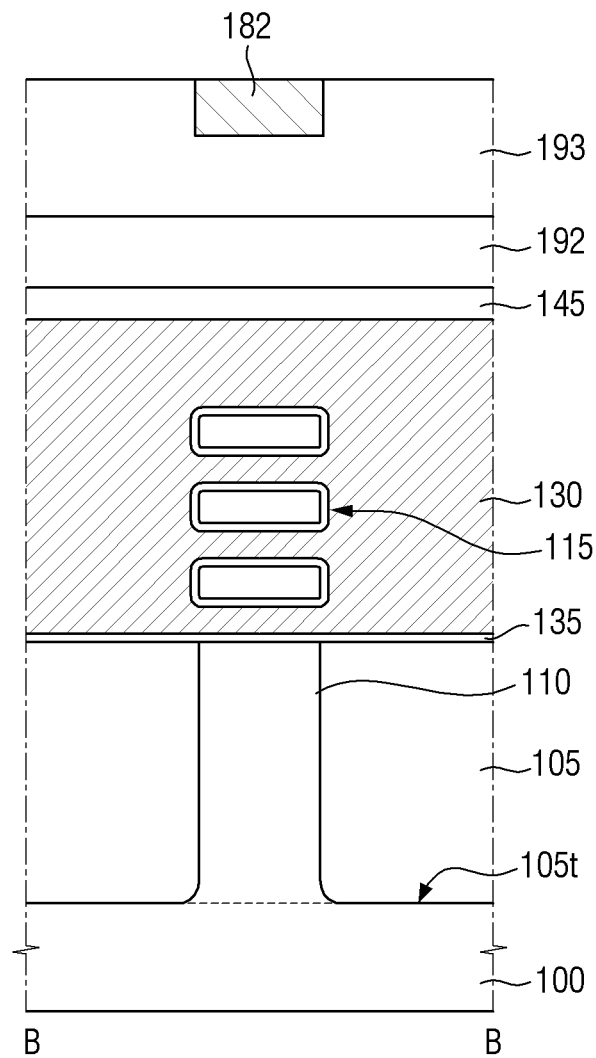
FIG. 3 illustrates a cross-sectional view taken along line B-B of FIG. 1.
Figure 4:
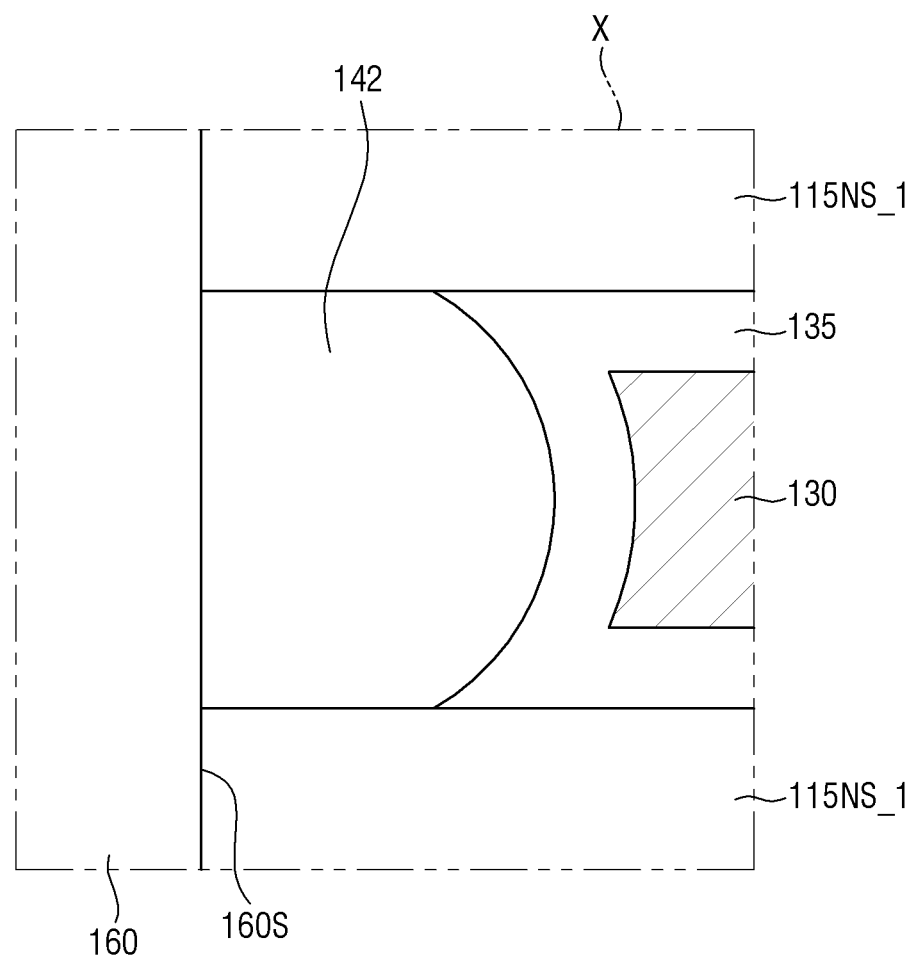
FIG. 4 illustrates an enlarged view of portion X of FIG. 2.
Figure 5:
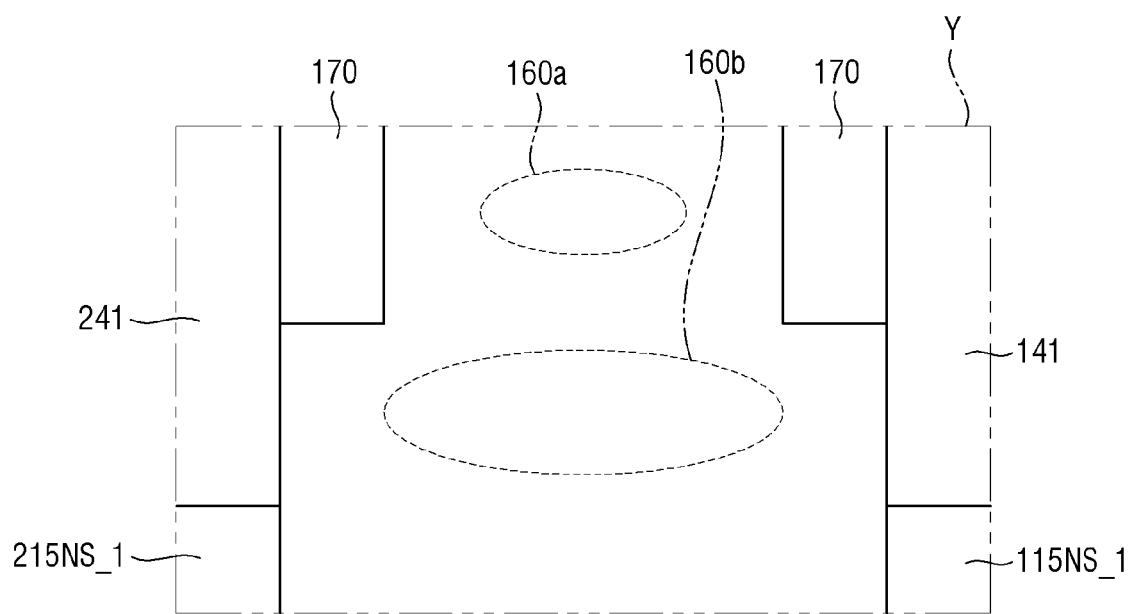
FIG. 5 illustrates an enlarged view of portion Y of FIG. 2.

FIG. 1 is a plan view illustrating a semiconductor device according to an example embodiment. FIG. 2 is a cross-sectional view taken along line A-A of FIG. 1. FIG. 3 is a cross-sectional view taken along line B-B of FIG. 1. FIG. 4 is an enlarged view of portion X of FIG. 2. FIG. 5 is an enlarged view of portion Y of FIG. 2.

Referring to FIGS. 1 to 5, a semiconductor device according to an example embodiment may include a substrate 100, a first lower pattern 110, a second lower pattern 210, first active pattern stacks 115 and 115_1, a first fin-cut pattern stack 116, contacts 175 and 275, a wiring structure 180, interlayer insulation layers 191, 192, and 193, second active pattern stacks 215 and 215_1, a second fin-cut pattern stack 216, a second fin-cut pattern stack 216, first gate structures 120 and 120_1, second gate structures 220 and 220_1, a first fin-cut gate structure 120_2, a second fin-cut gate structure 220_2, and a first device isolation layer 160. (For convenience of explanation, in FIG. 1, the interlayer insulation layers 191, 192, and 193, the contacts 175 and 275, and the wiring structure 180 are omitted.)

The substrate 100 may be, for example, a bulk silicon substrate or a silicon-on-insulator (SOI) substrate. In an example embodiment, the substrate 100 may include for example, silicon germanium, silicon germanium on insulator (SGOI), indium antimonide, lead tellurium compound, indium arsenide, indium phosphide, gallium arsenide or gallium antimonide, etc.

The first lower pattern 110 and the second lower pattern 210 may protrude from the substrate 100. The first lower pattern 110 and the second lower pattern 210 may respectively extend lengthwise along a first direction X1 parallel to an upper surface of the substrate 100. The first lower pattern 110 and the second lower pattern 210 may be arranged in a line in the first direction X1 and may be spaced apart from each other in the first direction X1.

A long sidewall of the first lower pattern 110 and a long sidewall of the second lower pattern 210 that extend in the first direction X1 may be defined by a fin trench 105t. In addition, one of short sidewalls of the first lower pattern 110 and one of short sidewalls of the second lower pattern 210 that extend in a second direction Y1 crossing the first direction X1 may be defined by the fin trench 105t. The short sidewall of the first lower pattern 110 and the short sidewall of the second lower pattern 210 may be defined by a first device isolation trench 160t. Each of the first lower pattern 110 and the second lower pattern 210 may have, for example, a fin type shape. In an implementation, the first lower pattern 110 and the second lower pattern 210 may be completely separated by the first device isolation trench 160t. A semiconductor pattern for connecting a lower portion of the first lower pattern 110 and a lower portion of the second lower pattern 210 may be disposed between the first device isolation layer 160 and the substrate 100.

Each of the first lower pattern 110 and the second lower pattern 210 may be formed by etching a portion of the substrate 100 or may include an epitaxial layer grown from the substrate 100. Each of the first lower pattern 110 and the second lower pattern 210 may include a semiconductor material, for example, silicon (Si) or germanium (Ge). In an example embodiment, each of the first lower pattern 110 and the second lower pattern 210 may include a compound semiconductor, for example, a group IV-IV compound semiconductor or a group III-V compound semiconductor.

The group IV-IV compound semiconductor may include a binary compound or a ternary compound including at least two of carbon (C), silicon (Si), germanium (Ge), and tin (Sn), or a compound doped with a group IV element. The group III-V compound semiconductor may include a binary compound, a ternary compound, or a quaternary compound, each of which is formed by combination of a group III element, for example, at least one of aluminum (Al), gallium (Ga), and indium (In), and a group V element, for example, one of phosphorus (P), arsenic (As), and antimony (Sb).

The first lower pattern 110 and the second lower pattern 210 may include the same material.

The field insulation layer 105 may be formed on the substrate 100. The field insulation layer 105 may fill at least a portion of the fin trench 105t. The field insulation layer 105 may be disposed on a sidewall of the first lower pattern 110 and a sidewall of the second lower pattern 210. The field insulation layer 105 may include, for example, at least one of silicon oxide, silicon nitride, and silicon oxynitride.

The first active pattern stacks 115 and 115_1 and the first fin-cut pattern stack 116 may be disposed on the first lower pattern 110, and may be spaced apart from the first lower pattern 110 in a thickness direction Z of the substrate 100.

The first active pattern stacks 115 and 115_1 and the first fin-cut pattern stack 116 may respectively include one or more sheet patterns 115NS, 115NS_1, and 116NS that are arranged in the thickness direction Z of the substrate 100. The first active pattern stacks 115 and 115_1 and the first fin-cut pattern stack 116 may respectively include a plurality of sheet patterns 115NS, 115NS_1, and 116NS. For example, each of the first active pattern stacks 115 and 115_1 and the first fin-cut pattern stack 116 may include three sheet patterns.

The first active pattern stacks 115 and 115_1 may include a first normal pattern stack 115 and a first dummy pattern stack 115_1. The first active pattern stacks 115 and 115_1 and the first fin-cut pattern stack 116 may be arranged in the first direction X1 along an upper surface of the first lower pattern 110. A first epitaxial pattern 150 may be disposed between respective ones of the first active pattern stacks 115 and 115_1 and the first fin-cut pattern stack 116.

The first normal pattern stack 115 may be connected to two first epitaxial patterns 150 at opposite sides of the first normal pattern stack 115. Each of the first dummy pattern stack 115_1 and the first fin-cut pattern stack 116 may be connected to one first epitaxial pattern 150. The first fin-cut pattern stack 116 may be disposed on one end portion of the first lower pattern 110 defined by the fin trench 105t. The first dummy pattern stack 115_1 may be disposed on another end portion of the first lower pattern 110 defined by the first device isolation trench 160t.

The second active pattern stacks 215 and 215_1 and the second fin-cut pattern stack 216 may be disposed on the second lower pattern 210. and may be spaced apart from the second lower pattern 210 in the thickness direction Z of the substrate 100.

The second active pattern stacks 215 and 215_1 and the second fin-cut pattern stack 216 may respectively include one or more sheet patterns 215NS, 215NS_1, and 216NS that are arranged in the thickness direction Z of the substrate 100.

The second active pattern stacks 215 and 215_1 may include a second normal pattern stack 215 and a second dummy pattern stack 215_1. The second active pattern stacks 215 and 215_1 and the second fin-cut pattern stack 216 may be arranged in the first direction X1 along an upper surface of the second lower pattern 210. A second epitaxial pattern 250 may be disposed between respective ones of the second active pattern stacks 215 and 215_1 and the second fin-cut pattern stack 216.

The second normal pattern stack 215 may be connected to two second epitaxial patterns 250 at opposite sides of the second normal pattern stack 215. Each of the second dummy pattern stack 215_1 and the second fin-cut pattern stack 216 may be connected to one second epitaxial pattern 250. The second fin-cut pattern stack 216 may be disposed on one end portion of the second lower pattern 210 defined by the fin trench 105t. The second dummy pattern stack 215_1 may be disposed on another end portion of the second lower pattern 210 defined by the first device isolation trench 160t.

Each of the first active pattern stacks 115 and 115_1, the first fin-cut pattern stack 116, the second active pattern stacks 215 and 215_1, and the second fin-cut pattern stack 216 may include silicon, germanium, or compound semiconductor, such as a group Iv-Iv compound semiconductor or a group III-v compound semiconductor. The first active pattern stacks 115 and 115_1, the first fin-cut pattern stack 116, the second active pattern stacks 215 and 215_1, and the second fin-cut pattern stack 216 that are located at the same level may include the same material.

The first normal pattern stack 115 and the second normal pattern stack 215 may be used as channel regions of transistors of the same conductive type.

The first gate structures 120 and 120_1 and the first fin-cut gate structure 120_2 may extend in the second direction Y1 and may traverse the first lower pattern 110. The first gate structures 120 and 120_1 and the first fin-cut gate structure 120_2 may be disposed on the first lower pattern 110.

The first fin-cut gate structure 120_2 may overlap a portion of the first lower pattern 110. The first gate structures 120 and 120_1 may overlap the first lower pattern 110. For example, an overlapping width between the first fin-cut gate structure 120_2 and the first lower pattern 110 in the first direction X1. may be smaller than a width of the first fin-cut gate structure 120_2 in the first direction X1. An overlapping width between each of the first gate structures 120 and 120_1 and the first lower pattern 110 may be the same as a width of each of the first gate structures 120 and 120_1 in the first direction X1.

The first gate structures 120 and 120_1 may surround the first active pattern stacks 115 and 115_1, respectively. The first gate structures 120 and 120_1 may include a first normal gate structure 120 surrounding the first normal pattern stack 115 and a first dummy gate structure 120_1 surrounding the first dummy pattern stack 115_1. The first fin-cut gate structure 120_2 may cover the first fin-cut pattern stack 116.

The second gate structures 220 and 220_1 and the second fin-cut gate structure 220_2 may extend in the second direction Y1 and may traverse the second lower pattern 210. The second gate structures 220 and 220_1 and the second fin-cut gate structure 220_2 may be disposed on the second lower pattern 210. The second fin-cut gate structure 220_2 may overlap a portion of the second lower pattern 210. The second gate structures 220 and 220_1 may overlap the second lower pattern 210.

The second gate structures 220 and 220_1 may surround the second active pattern stacks 215 and 215_1, respectively. The second gate structures 220 and 220_1 may include a second normal gate structure 220 surrounding the second normal pattern stack 215 and a second dummy gate structure 220_1 surrounding the second dummy pattern stack 215_1.

The second fin-cut gate structure 220_2 may cover the second fin-cut pattern stack 216.

Each of the first gate structures 120 and 120_1 and the first fin-cut gate structure 120_2 may include a first gate electrode 130, a first gate insulation layer 135, first gate spacers 140, and a first capping pattern 145. Each of the second gate structures 220 and 220_1 and the second fin-cut gate structure 220_2 may include a second gate electrode 230, a second gate insulation layer 235, second gate spacers 240, and a second capping pattern 245. Hereafter, the first gate structures 120 and 120_1 and the first fin-cut gate structure 120_2 will be further described. Descriptions of the second gate structures 220 and 220_1 and the second fin-cut gate structure 220_2 may easily be understood through descriptions of the first gate structures 120 and 120_1 and the first fin-cut gate structure 120_2.

The first gate spacers 140 may extend in the second direction Y1. The first gate spacers 140 may cross the first active pattern stacks 115 and 115_1 and the first fin-cut pattern stack 116. The first gate spacers 140 may be disposed on opposite ends of each of the first active pattern stacks 115 and 115_1 extending in the first direction X1. The first normal sheet patterns 115NS and the first dummy sheet patterns 115NS_1 may penetrate the first gate spacers 140 that are opposite to each other. The first fin-cut sheet pattern 116NS may penetrate one of the first gate spacers 140 that are opposite to each other.

Each of the first gate spacers 140 may include a first inner spacer 142 and a first outer spacer 141. The first inner spacer 142 may disposed between the first lower pattern 110 and each of the first active pattern stacks 115 and 115_1, between the first lower pattern 110 and the first fin-cut pattern stack 116, and between respective ones of the sheet patterns 115NS, 115NS_1, and 116NS that are adjacent to each other in the thickness direction Z of the substrate 100. The first outer spacer 141 may be disposed on each of the first active pattern stacks 115 and 115_1 and the first fin-cut pattern stack 116.

The first outer spacer 141 and the first inner spacer 142 may include, for example, silicon nitride (SiN), silicon oxynitride (SiON), silicon oxide ($SiO_2$), silicon oxycarbonitride (SiOCN), silicon boron nitride (SiBN), silicon oxyboronitride (SiOBN), silicon oxycarbide (SiOC), or a combination thereof. In an example embodiment, the first inner spacer 142 may be a single layer.

The first gate insulation layer 135 may extend along a surface of each of the first active pattern stacks 115 and 115_1 and the first fin-cut pattern stack 116. The first gate insulation layer 135 may be disposed on an upper surface of the field insulation layer 105 and on the first lower pattern 110. The first gate insulation layer 135 may extend along inner sidewalls of the first gate spacers 140. An interfacial layer may be disposed between the first gate insulation layer 135 and each of the first active pattern stacks 115 and 115_1, between the first gate insulation layer 135 and the first fin-cut pattern stack 116, between the first gate insulation layer 135 and the first lower pattern 110.

The first gate insulation layer 135 may include silicon oxide, silicon oxynitride, silicon nitride, and/or a high-k dielectric material having a higher dielectric constant than silicon oxide. The first gate insulation layer 135 may include the high-k dielectric material, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and/or lead zinc niobate.

As shown in FIG. 4, a boundary between the first inner spacer 142 and the first gate insulation layer 135 may be curved, for example.

The first gate electrode 130 may surround the surface of each of the first active pattern stacks 115 and 115_1 and the first fin-cut pattern stack 116. The first gate electrode 130 may be disposed on the first gate insulation layer 135, between the first gate spacers 140.

The first gate electrode 130 may include, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru). titanium aluminum (TiAl), titanium aluminum carbonitride (TiAlCN), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or a combination thereof. The first gate electrode 130 may include conductive metal oxide or conductive metal oxynitride. The first gate electrode 130 may include an oxidized form of the above-mentioned material.

The first capping pattern 145 may be disposed on the first gate electrode 130. In an implementation, the first gate insulation layer 135 may not be disposed between the first gate spacers 140 and the first capping pattern 145.

As shown in FIG. 2, the first capping pattern 145 may be disposed between the inner sidewalls of the first gate spacers 140, but the inventive concept is not limited thereto. In an example embodiment, upper surfaces of the first gate spacers 140 may be recessed lower than an upper surface of a first interlayer insulation layer 191 to be formed in a subsequent process, like the first gate electrode 130. In such a case, the first capping pattern 145 may be disposed on the upper surfaces of the first gate spacers 140 and an upper surface of the first gate electrode 130.

An upper surface of the first capping pattern 145 may be coplanar with the upper surface of the first interlayer insulation layer 191. The first capping pattern 145 may include a material having an etch selectivity with respect to a material of the first interlayer insulation layer 191. The first capping pattern 145 may include, for example, silicon nitride (SiN), silicon oxynitride (SiON), silicon oxide (SiO$_2$), silicon carbonitride (SiCN), silicon oxycarbonitride (SiOCN), or a combination thereof.

A first epitaxial pattern 150 may be disposed between respective ones of the first gate structures 120 and 120_1 and the first fin-cut gate structure 120_2. The first epitaxial pattern 150 may be disposed on the first lower pattern 110. A second epitaxial pattern 250 may be disposed between respective ones of the second gate structures 220 and 220_1 and the second fin-cut gate structure 220_2. The second epitaxial pattern 250 may be disposed on the second lower pattern 210. The first epitaxial pattern 150 and the second epitaxial pattern 250 may be formed by an epitaxial growth process.

The first epitaxial pattern 150 may be included in a source/drain of the transistor utilizing the first normal pattern stack 115 as the channel region. The second epitaxial pattern 250 may be included in a source/drain of the transistor utilizing the second normal pattern stack 215 as the channel region.

A first etch stop layer 170 may be disposed on an upper surface of the first epitaxial pattern 150, an upper surface of the second epitaxial pattern 250, outer sidewalls of the first gate spacers 140, outer sidewalls of the second gate spacers 240, and an upper surface of the field insulation layer 105. The first etch stop layer 170 may include, for example, silicon nitride (SiN), silicon oxynitride (SiON), silicon oxide (SiO$_2$), silicon oxycarbonitride (SiOCN), or a combination thereof. The first etch stop layer 170 may include a material having an etch selectivity with respect to the material of the first interlayer insulation layer 191.

The first interlayer insulation layer 191 may be disposed on the first etch stop layer 170. The first interlayer insulation layer 191 may cover the outer sidewalls of the first gate spacers 140 and the outer sidewalls of the second gate spacers 240. The first interlayer insulation layer 191 may include, for example, silicon oxide, silicon nitride, and/or silicon oxynitride.

A second interlayer insulation layer 192 may be disposed on the first interlayer insulation layer 191. The second interlayer insulation layer 192 may cover the first gate structures 120 and 120_1, the first fin-cut gate structure 120_2, the second gate structures 220 and 220_1, and the second fin-cut gate structure 220_2. The second interlayer insulation layer 192 may include, for example, at least one of silicon oxide, silicon nitride, and silicon oxynitride.

The first device isolation layer 160 may be disposed between the first lower pattern 110 and the second lower pattern 210. The first device isolation layer 160 may separate the first lower pattern 110 and the second lower pattern 210. The first device isolation layer 160 may be disposed between the first gate structure (i.e., the first dummy gate structure) 120_1 and the second gate structure (i.e., the second dummy gate structure) 220_1. The first device isolation layer 160 may extend along a sidewall of the first dummy gate structure 120_1 and a sidewall of the second dummy gate structure 220_1.

The first device isolation layer 160 may fill the first device isolation trench 160t. A portion of the first device isolation trench 160t may be defined by the first lower pattern 110 and the second lower pattern 210. The first device isolation layer 160 may extend between the first dummy gate structure 120_1 and the second dummy gate structure 220_1, between the first dummy pattern stack 115_1 and the second dummy pattern stack 215_1, and between the first lower pattern 110 and the second lower pattern 210. The first device isolation layer 160 may extend lengthwise in the thickness direction Z of the substrate 100.

In an example embodiment, the first device isolation layer 160 may contact the first dummy pattern stack 115_1 and the second dummy pattern stack 215_1. The first device isolation layer 160 may contact the first inner spacer 142 and the second inner spacer 242. As shown in FIGS. 2 and 4, the first inner spacer 142 and the second inner spacer 242 may protrude in the first direction X1 from a sidewall 160s of the first device isolation layer 160.

As an example, a height from the upper surface of the first lower pattern 110 to an upper surface of the first device isolation layer 160 may be greater than a height from the upper surface of the first lower pattern 110 to an upper surface of the first dummy gate structure 120_1. In an example embodiment, the height from the upper surface of the first lower pattern 110 to the upper surface of the first device isolation layer 160 may be equal to the height from the upper surface of the first lower pattern 110 to the upper surface of the first dummy gate structure 120_1.

On an uppermost surface of the first dummy pattern stack 115_1, the first device isolation layer 160 may have a first width W11 in the first direction X1. On the upper surface of the first lower pattern 110, the first device isolation layer 160 may have a second width W12 in the first direction X1. In an example embodiment, the first width W11 of the first device isolation layer 160 may be equal to the second width W12 of the first device isolation layer 160.

Here, the uppermost surface of the first dummy pattern stack 115_1 may be an upper surface of an uppermost one of the first dummy sheet patterns 115NS_1 included in the first dummy pattern stack 115_1. For example, the first width W11 of the first device isolation layer 160 may be a distance between an outer sidewall of the first outer spacer 141 and an outer sidewall of the second outer sidewall 241, on the uppermost surface of the first dummy pattern stack 115_1.

The first device isolation layer 160 may include a first portion contacting the first lower pattern 110 and the second lower pattern 210, a second portion between the upper surface of the first lower pattern 110 and the uppermost surface of the first dummy pattern stack 115_1, and a third portion between the uppermost surface of the first dummy pattern stack 115_1 and the upper surface of the first dummy gate structure 120_1.

The first portion of the first device isolation layer 160 may have a third width W13 in the first direction X1. The third width W13 of the first portion of the first device isolation layer 160 may be smaller than the second width W12 of the first device isolation layer 160. As a distance from the substrate 100 increases, the third width W13 of the first device isolation layer 160 may increase. Thus, the third width W13 of the first portion of the first device isolation layer 160 may decrease in a direction from the upper surface of the first lower pattern 110 to the substrate 100.

The second portion of the first device isolation layer 160 may have a fourth width W14 in the first direction X1. In an example embodiment, the fourth width W14 of the second portion of the first device isolation layer 160 may be constant. The fourth width W14 of the second portion of the first device isolation layer 160 may be constant between the upper surface of the first lower pattern 110 and the uppermost surface of the first dummy pattern stack 115_1. For example, since a material of the first dummy pattern stack 115_1 and a material of the first inner spacer 142 is different, the sidewall 160s of the first device isolation layer 160 may include a fine unevenness. As used herein, "the width is constant" means that a distance between opposite sidewalls 160s of the first device isolation layer 160 is exactly equal but a fine variation in the width generated due to the fine unevenness of the sidewall 160s of the first device isolation layer 160 is included.

In an example embodiment, a portion of the first etch stop layer 170 may be disposed between the third portion of the first device isolation layer 160 and the first dummy gate structure 120_1. Thus, portion of the first etch stop layer 170 may be disposed along a portion of the outer sidewall of the first outer spacer 141.

Thus, as shown in FIGS. 2 and 5, the third portion of the first device isolation layer 160 may include a second sub region 160b and a first sub region 160a on the second sub region 160b. In the third portion of the first device isolation layer 160, a width of the first sub region 160a in the first direction X1 may be smaller than a width of the second sub region 160b in the first direction X1.

As shown in FIG. 1, the first device isolation layer 160 may cross between two first lower patterns 110 and two second lower patterns 210, but the inventive concept is not limited thereto.

The first device isolation layer 160, the first inner spacer 142, and the second inner spacer 242 may constitute an insulation pattern. The insulation pattern may include a linear insulation pattern extending lengthwise in the thickness direction Z of the substrate 100 and protruding insulation patterns protruding in the first direction X1 from the linear insulation pattern and contacting the linear insulation pattern.

For example, the linear insulation pattern may be a first device isolation layer 160, and each of the protruding insulation patterns may be the first inner spacer 142 and the second inner spacer 242. The protruding insulation patterns may contact a plurality of first dummy sheet patterns 115NS_1 and a plurality of second dummy sheet patterns 215NS_1.

The linear insulation pattern may contact the first lower pattern 110 and the second lower pattern 210. The protruding insulation patterns may be disposed on an upper surface of the first lower pattern 110 and an upper surface of the second lower pattern 210. Since each of the protruding insulation patterns is the first inner spacer 142 and the second inner spacer 242, a portion of the first dummy sheet pattern 115NS_1 and a portion of the second dummy sheet pattern 215NS_1 may be disposed between the protruding insulation patterns that are adjacent to each other in the thick direction Z of the substrate 100.

A first contact 175 and a second contact 275 may be disposed in the second interlayer insulation layer 192 and the first interlayer insulation layer 191. The first contact 175 may be connected to the first epitaxial pattern 150 on the first lower pattern 110. The second contact 275 may be connected to the second epitaxial pattern 250 on the second lower pattern 210. A silicide layer may be disposed between the first contact 175 and the first epitaxial pattern 150 and between the second contact 275 and the second epitaxial pattern 250. The first contact 175 may be connected to one first epitaxial pattern 150, and the second contact 275 may be connected to one second epitaxial pattern 250.

In an example embodiment, an upper surface of the first contact 175, an upper surface of the second contact 275, the upper surface of the first device isolation layer 160, and an upper surface of the second interlayer insulation layer 192 may be coplanar with each other. For example, a height from the upper surface of the first lower pattern 110 to the upper surface of the first contact 175 may be equal to a height from the upper surface of the first lower pattern 110 to the upper surface of the first device isolation layer 160. As used herein, "the height is equal" means that heights of two positions are exactly equal but a fine difference in the height generated due to a process margin is included.

The third interlayer insulation layer 193 may be disposed on the second interlayer insulation layer 192. The third interlayer insulation layer 193 may be disposed on the first contact 175, the second contact 275, and the first device isolation layer 160. The third interlayer insulation layer 193 may include, for example, at least one of silicon oxide, silicon nitride, silicon oxynitride.

A wiring structure 180 may be disposed on the third interlayer insulation layer 193. The wiring structure 180 may be formed in a back-end-of-line (BEOL) process.

The wiring structure 180 may be connected to the first contact 175 and the second contact 275. The wiring structure 180 may include a via pattern 181 and a wiring pattern 182.

Although each of the first contact 175, the second contact 275, and the wiring structure 180 is shown to be a single layer, this is merely an example.

Figure 6:
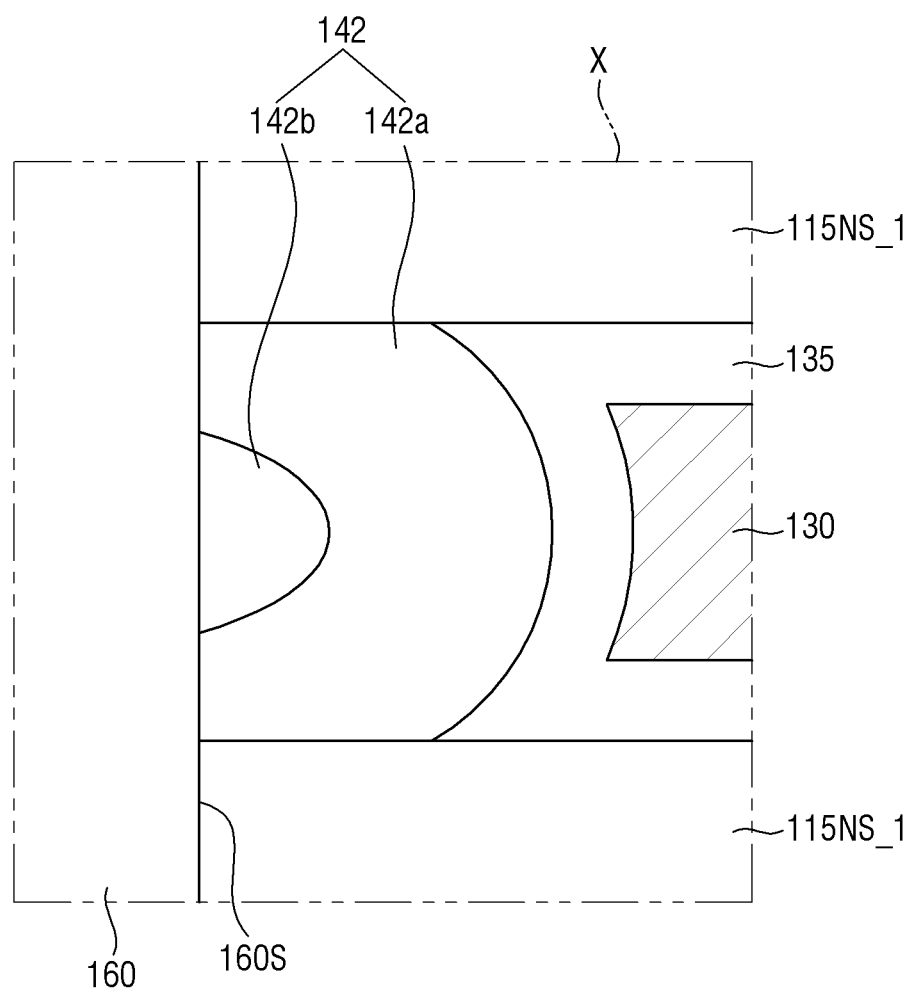
FIG. 6 illustrates a view of a semiconductor device according to an example embodiment.
Figure 7:
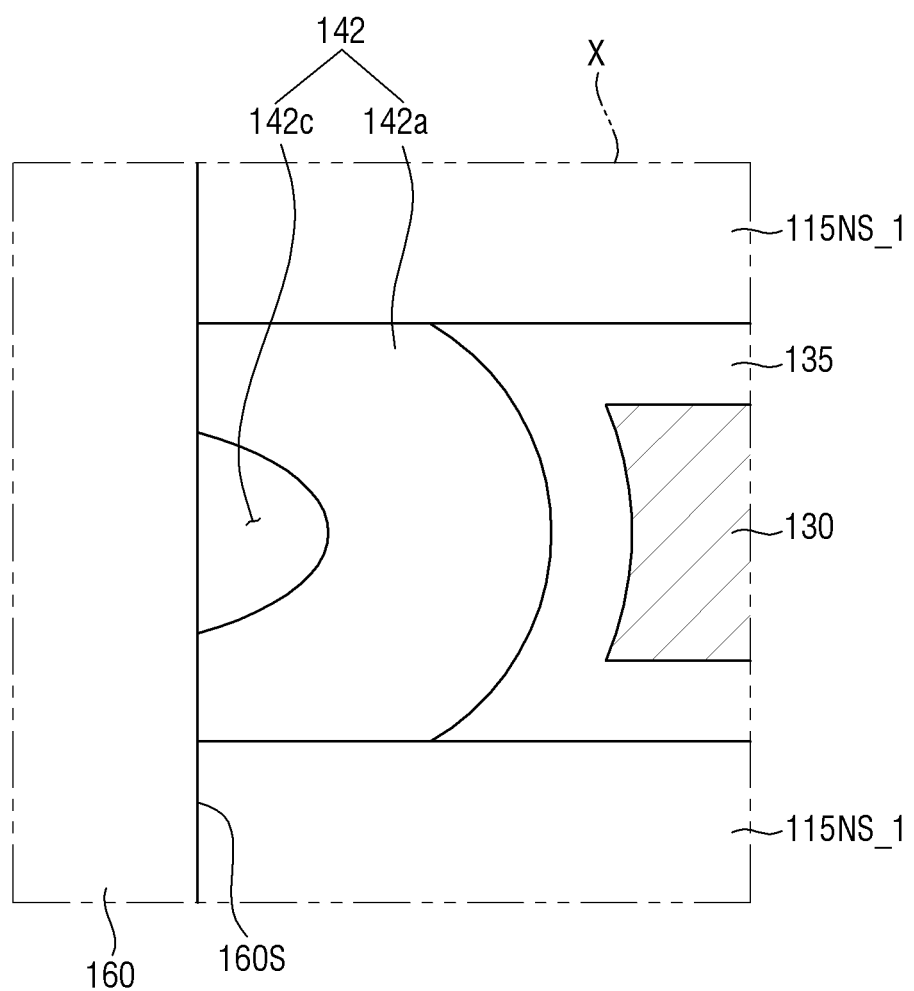
FIG. 7 illustrates a view of a semiconductor device according to an example embodiment.

FIG. 6 is a view illustrating a semiconductor device according to an example embodiment. FIG. 7 is a view illustrating a semiconductor device according to an example embodiment. FIGS. 6 and 7 are enlarged views of portion X of FIG. 2. The same elements as described with reference to FIGS. 1 to 5 will not be described again or will be briefly mentioned.

Referring to FIGS. 6 and 7, in a semiconductor device according to an example embodiment, the first inner spacer 142 may have a double-layered structure.

The first inner spacer 142 may include double layers including different materials.

As shown in FIG. 6, the first inner spacer 142 may include an outer protruding insulation layer 142a and an inner protruding insulation layer 142b. The outer protruding insulation layer 142a and the inner protruding insulation layer 142b may contact the first device isolation layer 160.

The outer protruding insulation layer 142a may contact the first gate insulation layer 135. The inner protruding insulation layer 142b may be disposed between the first device isolation layer 160 and the outer protruding insulation layer 142a. For example, the outer protruding insulation layer 142a may include silicon nitride, and the inner protruding insulation layer 142b may include silicon oxide.

As shown in FIG. 7, the first inner spacer 142 may include the outer protruding insulation layer 142a and an inner air gap insulation layer 142c. The outer protruding insulation layer 142a and the inner air gap insulation layer 142c may contact the first device isolation layer 160.

The inner air gap insulation layer 142c may include an air gap. The air gap may be disposed between the outer protruding insulation layer 142a and the first device isolation layer 160.

In an example embodiment, the second inner spacer 242 may have the same double-layered structure as the first inner spacer 142. In an example embodiment, the second inner spacer 242 may have a doubled-layered structure different from the first inner spacer 142. In an example embodiment, the second inner spacer 242 may have a single-layered structure.

The first inner spacer 142 may include two layers of different materials. In another example embodiment, the first inner spacer 142 may include three or more layers.

Figure 8:
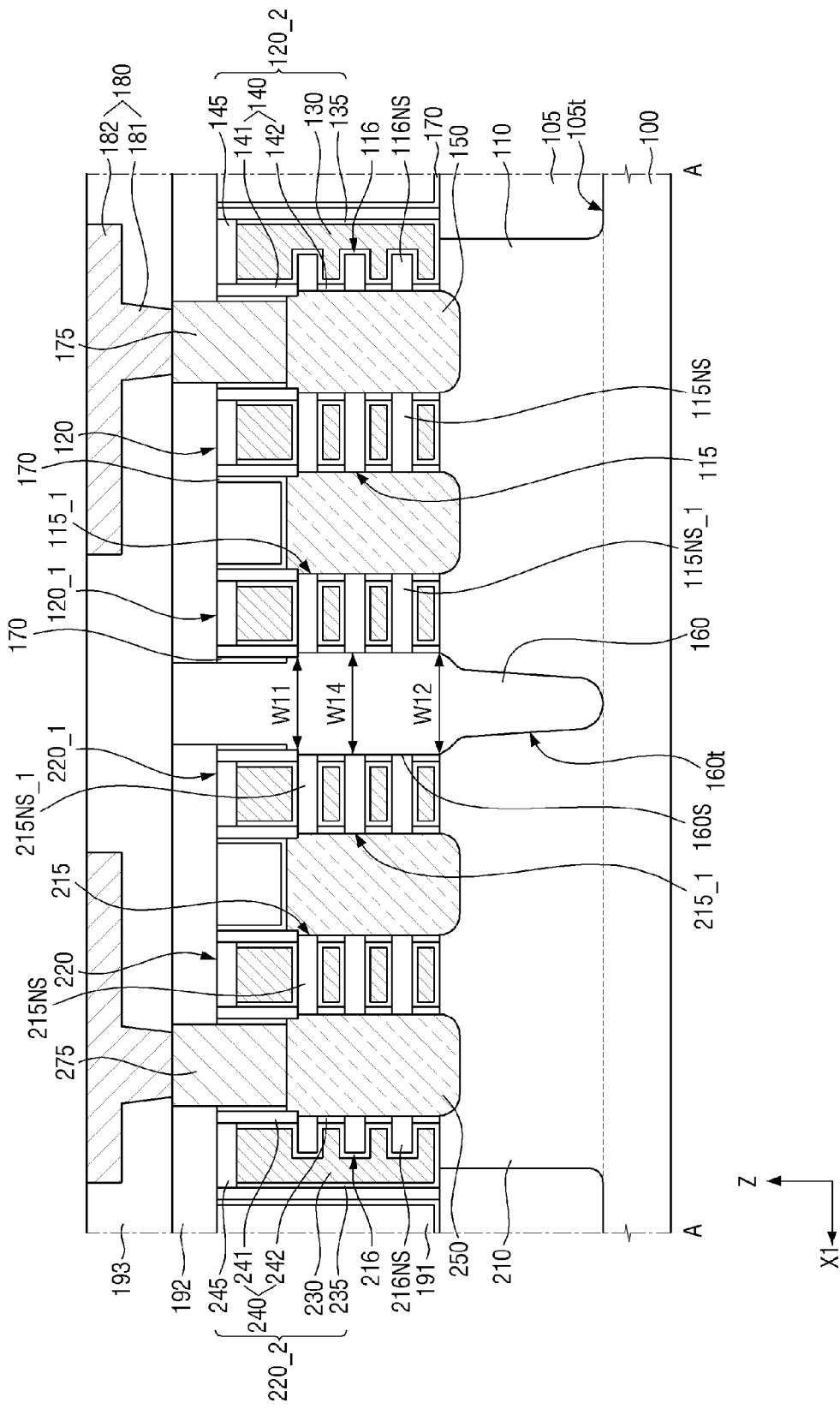
FIG. 8 illustrates a view of a semiconductor device according to an example embodiment.

FIG. 8 is a view illustrating a semiconductor device according to an example embodiment. The same elements as described with reference to FIGS. 1 to 5 will not be described again or will be briefly mentioned.

Referring to FIG. 8, in a semiconductor device according to an example embodiment, the first width W11 of the first device isolation layer 160 at an uppermost surface of the first dummy pattern stack 115_1 may be smaller than the second width W12 of the first device isolation layer 160 at an upper surface of the first lower pattern 110.

The fourth width W14 of the first device isolation layer 160 between the upper surface of the first lower pattern 110 and the uppermost surface of the first dummy pattern stack 115_1 may be greater than the first width W11 of the first device isolation layer 160 at the uppermost of the first dummy pattern stack 115_1.

Figure 9:
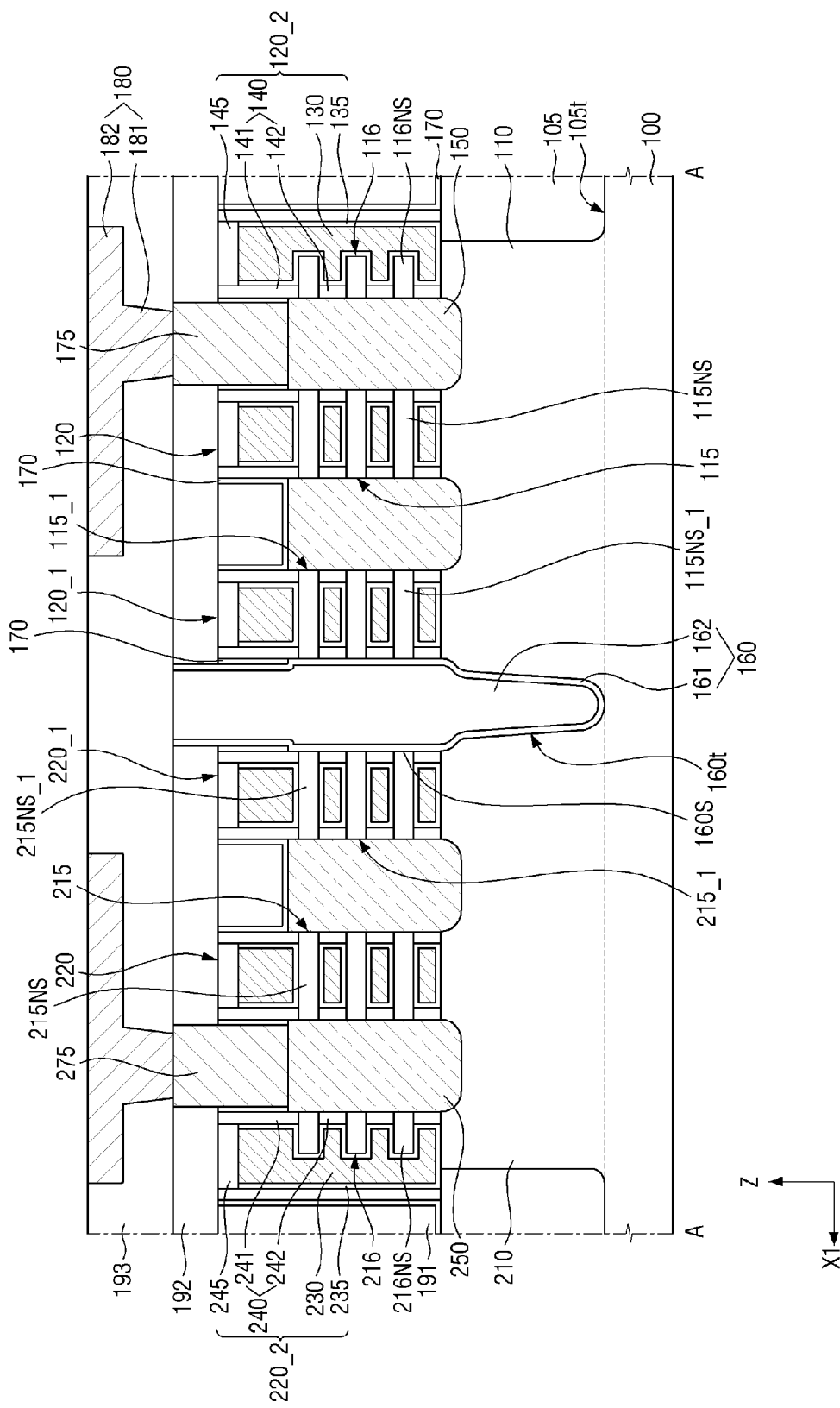
FIG. 9 illustrates a view of a semiconductor device according to an example embodiment.

FIG. 9 is a view illustrating a semiconductor device according to an example embodiment. The same elements as described with reference to FIGS. 1 to 5 will not be described again or will be briefly mentioned.

Referring to FIG. 9, in a semiconductor device according to an example embodiment, the first device isolation layer 160 may include a first device isolation liner 161 and a first device isolation filling layer 162.

The first device isolation liner 161 may extend along a sidewall and a bottom surface of a first device isolation trench 160t. The first device isolation filling layer 162 may be disposed on the first device isolation liner 161 and may fill the first device isolation trench 160t. The first device isolation liner 161 and the first device isolation filling layer 162 may include different materials.

Figure 10:
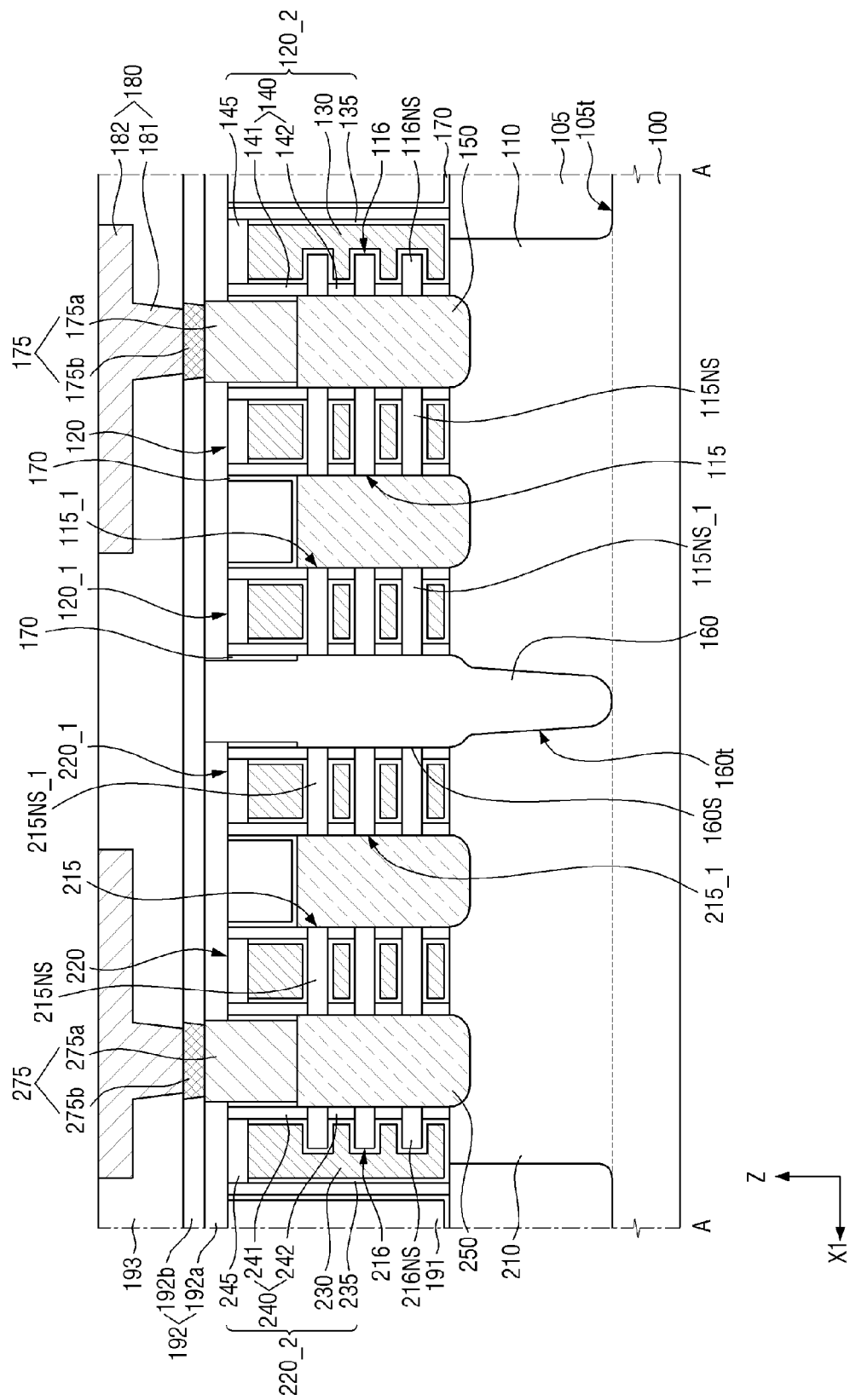
FIG. 10 illustrates a view of a semiconductor device according to an example embodiment.

FIG. 10 is a view illustrating a semiconductor device according to an example embodiment. The same elements as described with reference to FIGS. 1 to 5 will not be described again or will be briefly mentioned.

Referring to FIG. 10, the first contact 175 may include a first lower contact 175a and a first upper contact 175b. The second contact 275 may include a second lower contact 275a and a second upper contact 275b.

The second interlayer insulation layer 192 may include a second lower interlayer insulation layer 192a on the first interlayer insulation layer 191 and a second upper interlayer insulation layer 192b on the second lower interlayer insulation layer 192a.

The first lower contact 175a and the second lower contact 275a may be disposed in the second lower interlayer insulation layer 192a and the first interlayer insulation layer 191. The first upper contact 175b and the second upper contact 275b may be disposed in the second upper interlayer insulation layer 192b. The first device isolation layer 160 may be disposed in the second lower interlayer insulation layer 192a, but may not be disposed in the second upper interlayer insulation layer 192b. The second upper interlayer insulation layer 192b may cover an upper surface of the first device isolation layer 160.

In an example embodiment, an upper surface of the first lower contact 175a, an upper surface of the second lower contact 275a, the upper surface of the first device isolation layer 160, and an upper surface of the second lower interlayer insulation layer 192a may be coplanar with each other.

A height from an upper surface of the first lower pattern 110 to the upper surface of the first lower contact 175a may be equal to a height from the upper surface of the first lower pattern 110 to the upper surface of the first device isolation layer 160. The height from the upper surface of the first lower pattern 110 to the upper surface of the first device isolation layer 160 may be smaller than a height from the upper surface of the first lower pattern 110 to an upper surface of the first contact 175.

Figure 11:
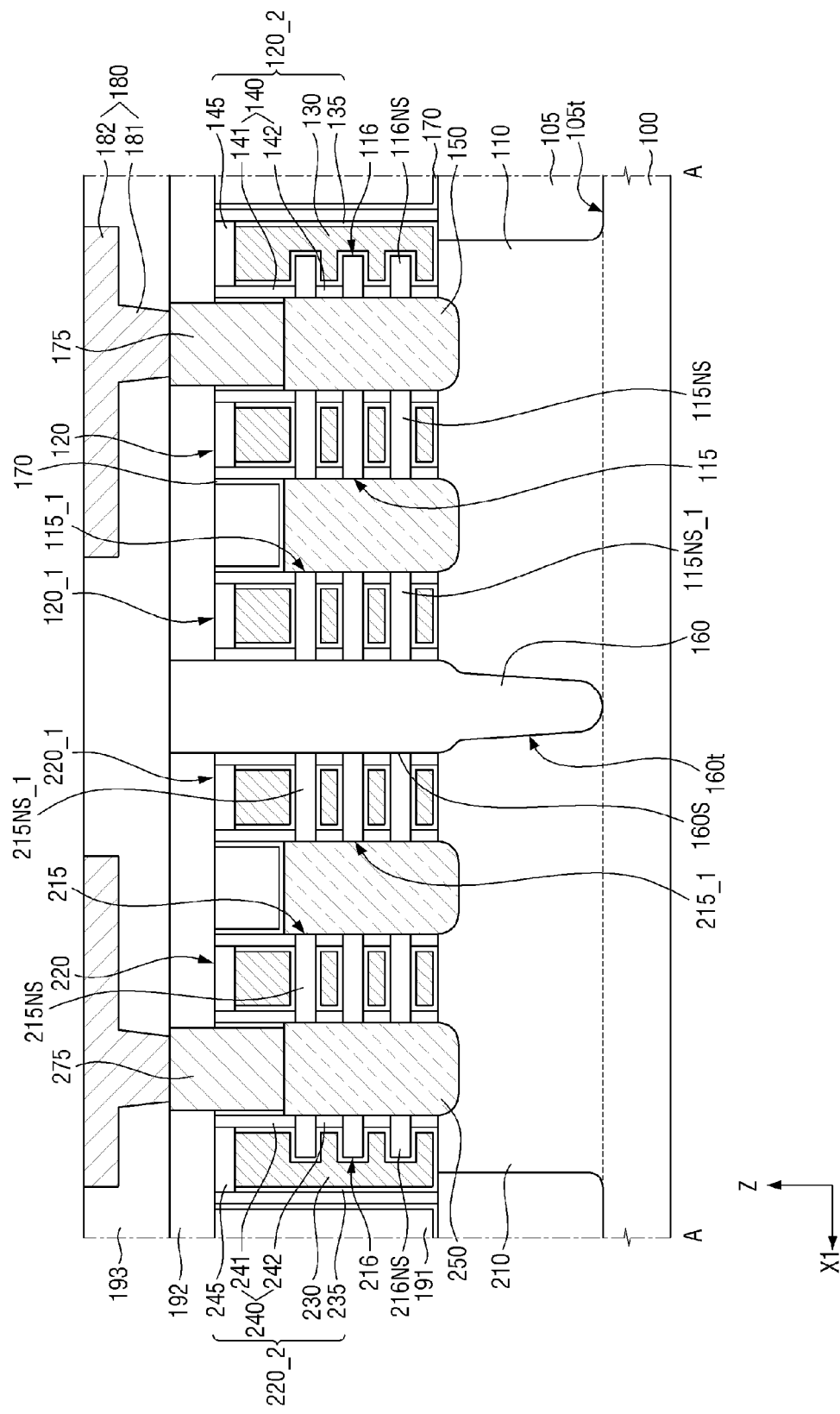
FIG. 11 illustrates a view of a semiconductor device according to an example embodiment.

FIG. 11 is a view illustrating a semiconductor device according to an example embodiment. The same elements as described with reference to FIGS. 1 to 5 will not be described again or will be briefly mentioned.

Referring to FIG. 11, in a semiconductor device according to an example embodiment, the first etch stop layer 170 may not be disposed between the first device isolation layer 160 and the first dummy gate structure 120_1 and between the first device isolation layer 160 and the second dummy gate structure 220_1.

A width of the first device isolation layer 160 in the first direction X1 between an uppermost surface of the first dummy pattern stack 115_1 and an upper surface of the first dummy gate structure 120_1 may be equal to a distance between the first dummy gate structure 120_1 and the second dummy gate structure 220_1.

Figure 12:
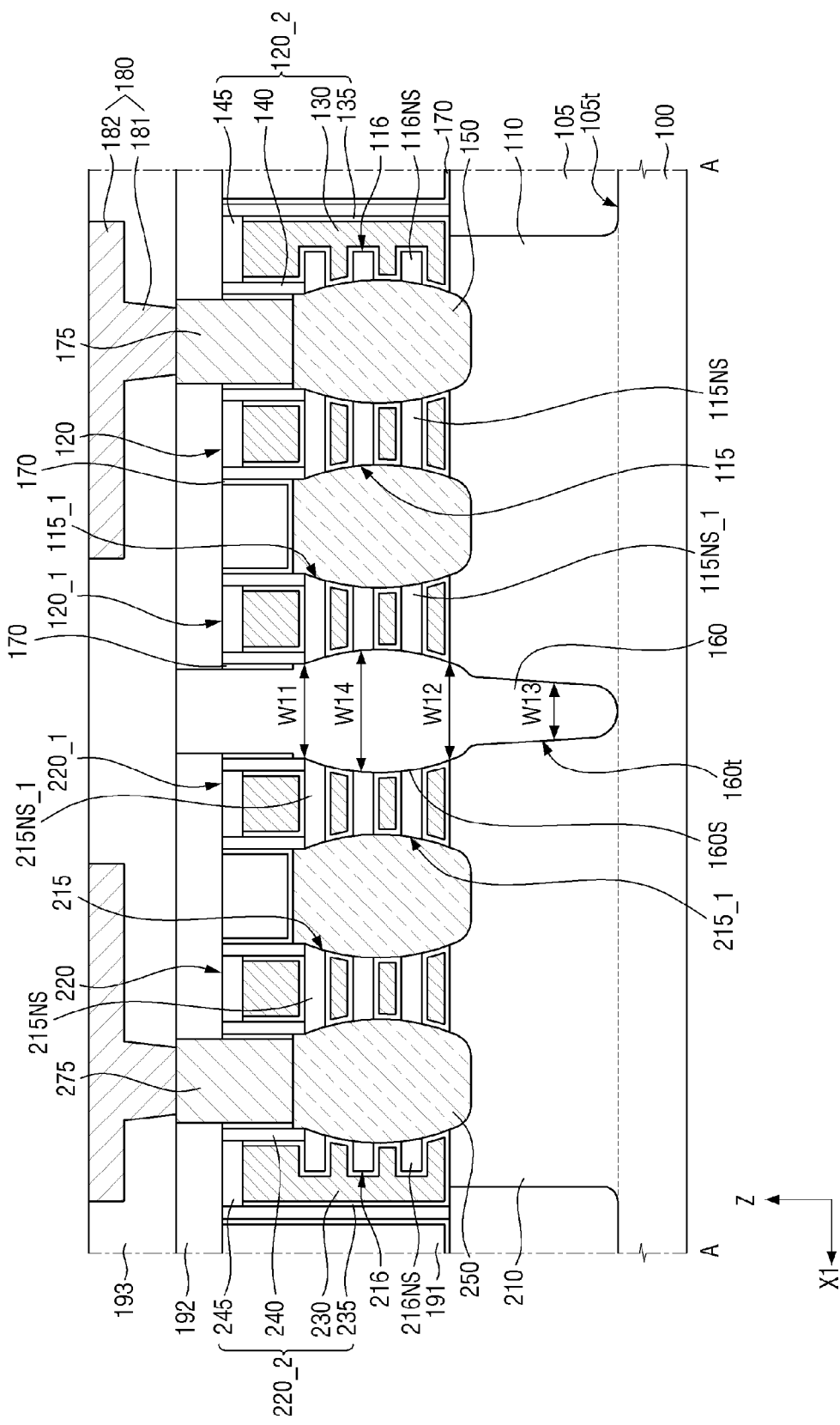
FIG. 12 illustrates a view of a semiconductor device according to an example embodiment.

FIG. 12 is a view illustrating a semiconductor device according to an example embodiment. The same elements as described with reference to FIGS. 1 to 5 will not be described again or will be briefly mentioned.

Referring to FIG. 12, in a semiconductor device according to an example embodiment, each of the first gate structures 120 and 120_1, the first fin-cut gate structure 120_2, the second gate structures 220 and 220_1, and the second fin-cut gate structure 220_2 may not include an inner spacer.

The first gate insulation layer 135 and the second gate insulation layer 235 may contact the first device isolation layer 160. The first gate insulation layer 135 may contact the first epitaxial pattern 150. The second gate insulation layer 235 may contact the second epitaxial pattern 250. The first width W11 of the first device isolation layer 160 at an uppermost surface of the first dummy pattern stack 115_1 may be equal to the second width W12 of the first device isolation layer 160 at an upper surface of the first lower pattern 110.

In an example embodiment, the fourth width W14 of the first device isolation layer 160 may not be constant between the upper surface of the first lower pattern 110 and the uppermost surface of the first dummy pattern stack 115_1. For example, the fourth width W14 of the first device isolation layer 160 may increase and then decrease between the upper surface of the first lower pattern 110 and the uppermost surface of the first dummy pattern stack 115_1. Thus, as a distance increases form the upper surface of the first lower pattern 110, the fourth width W14 of the first device isolation layer 160 may increase and then decrease between the upper surface of the first lower pattern 110 and the uppermost surface of the first dummy pattern stack 115_1.

Thus, the fourth width W14 of the first device isolation layer 160 may increase and then decrease in a direction from the upper surface of the first lower pattern 110 to the uppermost surface of the first dummy pattern stack 115_1.

Figure 13:
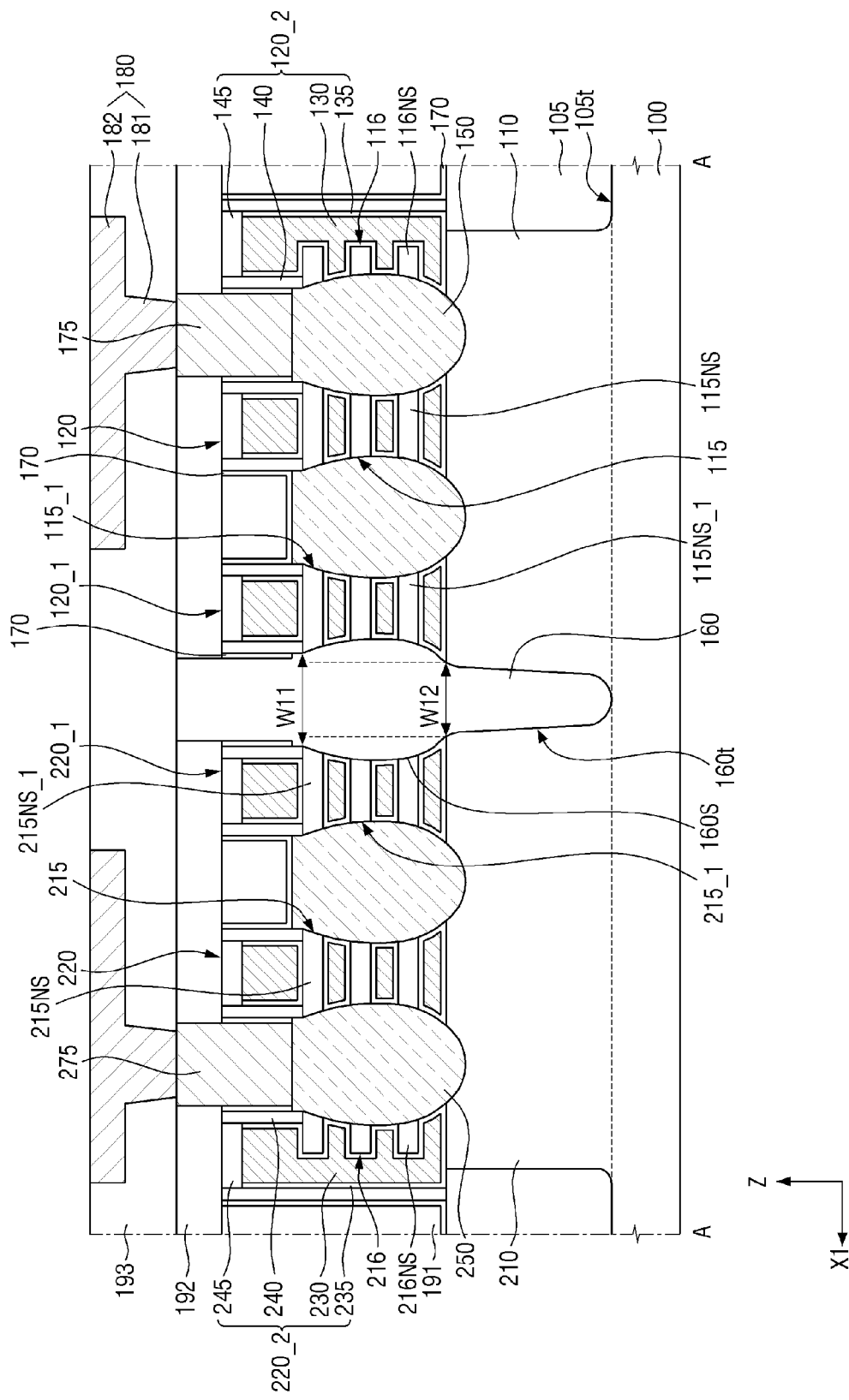
FIG. 13 illustrates a view of a semiconductor device according to an example embodiment.

FIG. 13 is a view illustrating a semiconductor device according to an example embodiment. The same elements as described with reference to FIGS. 1 to 5 will not be described again or will be briefly mentioned.

Referring to FIG. 13, in a semiconductor device according to an example embodiment, the first width W11 of the first device isolation layer 160 at an uppermost surface of the first dummy pattern stack 115_1 may be greater than the second width W12 of the first device isolation layer 160 at an upper surface of the first lower pattern 110.

The width of the first device isolation layer 160 may increase and then decrease in a direction from the upper surface of the first lower pattern 110 to the uppermost surface of the first dummy pattern stack 115_1.

Figure 14:
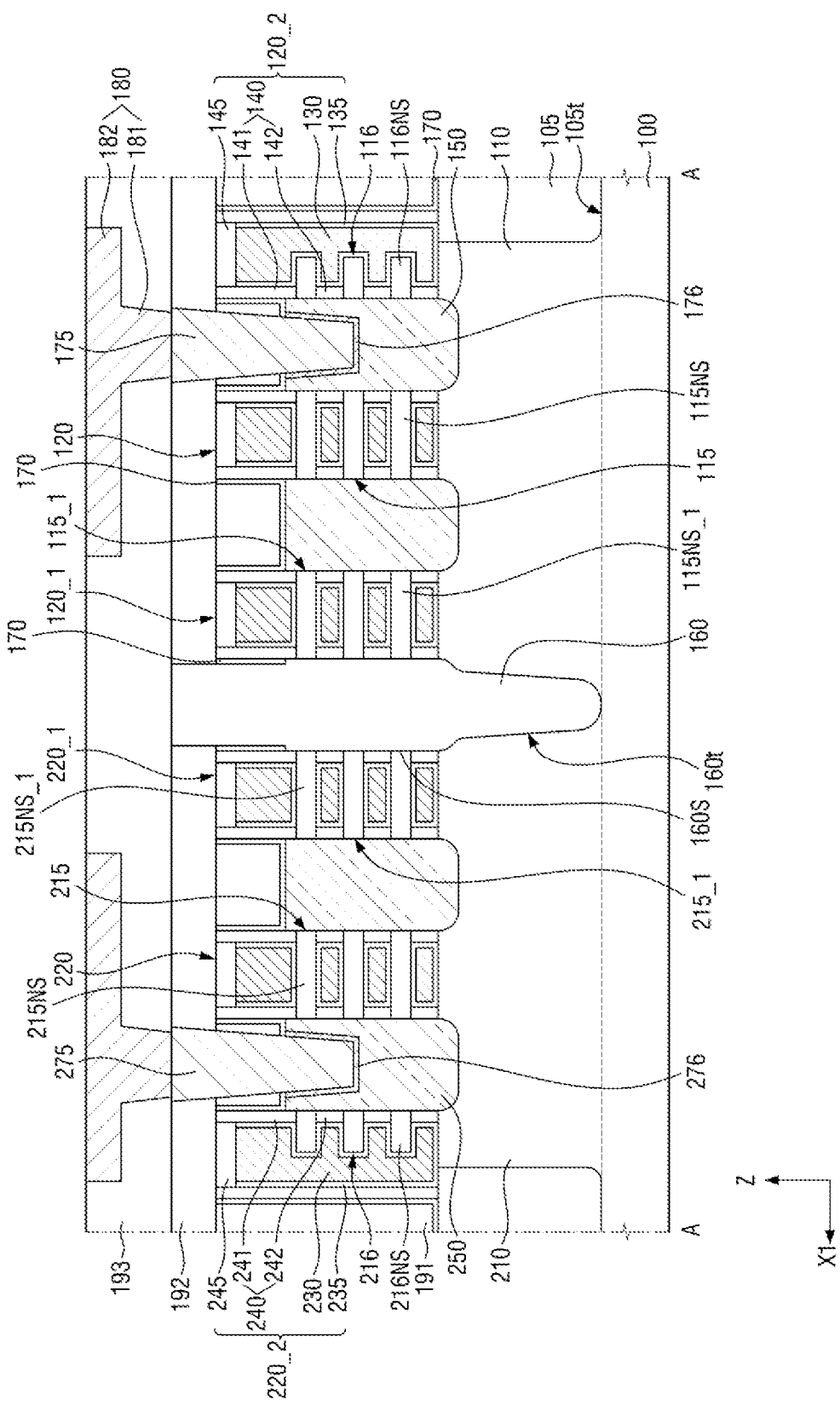
FIG. 14 illustrates a view of a semiconductor device according to an example embodiment.

FIG. 14 is a view illustrating a semiconductor device according to an example embodiment. The same elements as described with reference to FIGS. 1 to 5 will not be described again or will be briefly mentioned.

Referring to FIG. 14, in a semiconductor device according to an example embodiment, a portion of the first contact 175 may extend into the first epitaxial pattern 150. A portion of the second contact 275 may extend into the second epitaxial pattern 250.

A first silicide layer 176 may be disposed between the first epitaxial pattern 150 and the portion of the first contact 175 inserted into the first epitaxial pattern 150. A second silicide layer 276 may be disposed between the second epitaxial pattern 250 and the portion of the second contact 275 inserted into the second epitaxial pattern 250. Each of the first silicide layer 176 and the second silicide layer 276 may include a metal silicide.

A lower surface of the first contact 175 may be disposed between an upper surface of a lowermost one of respective ones of the plurality of sheet patterns 115NS, 115NS_1, and 116NS and a lower surface of an uppermost one of respective ones of the plurality of sheet patterns 115NS, 115NS_1, and 116NS. A lower surface of the second contact 275 may be disposed between an upper surface of a lowermost one of respective ones of the plurality of sheet patterns 215NS, 215NS_1, and 216NS and a lower surface of an uppermost one of respective ones of the plurality of sheet patterns 215NS, 215NS_1, and 216NS.

Figure 15:
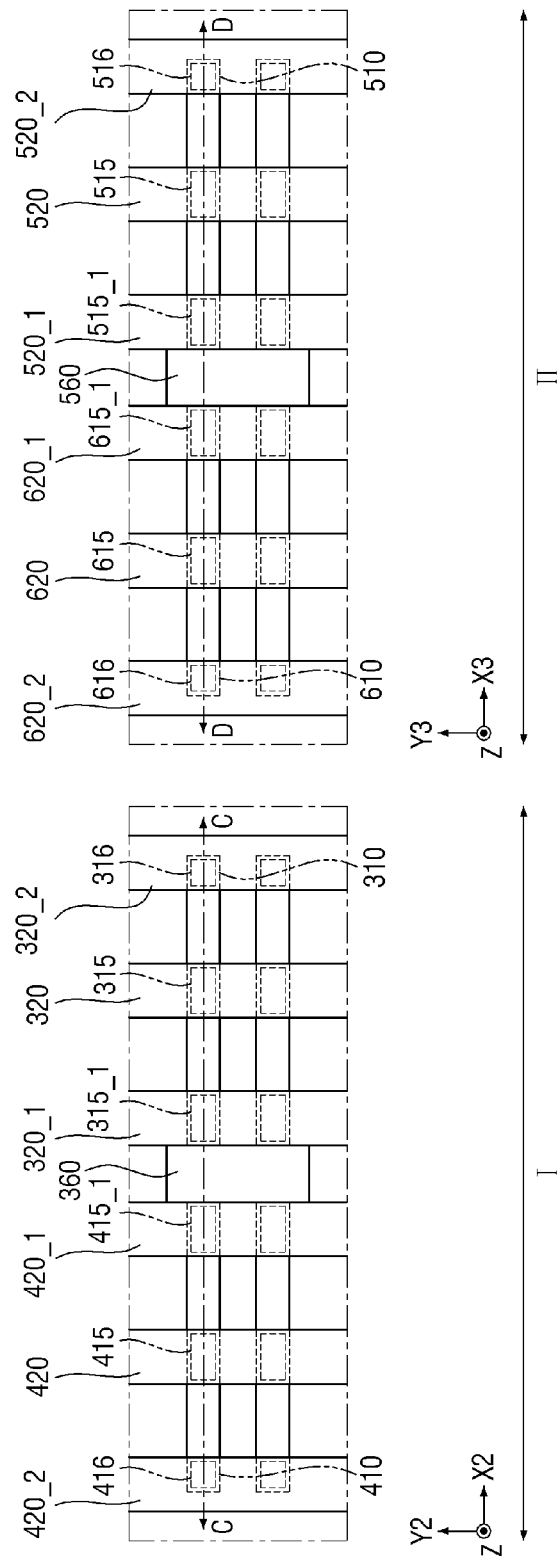
FIG. 15 illustrates a plan view of a semiconductor device according to an example embodiment.
Figure 16:
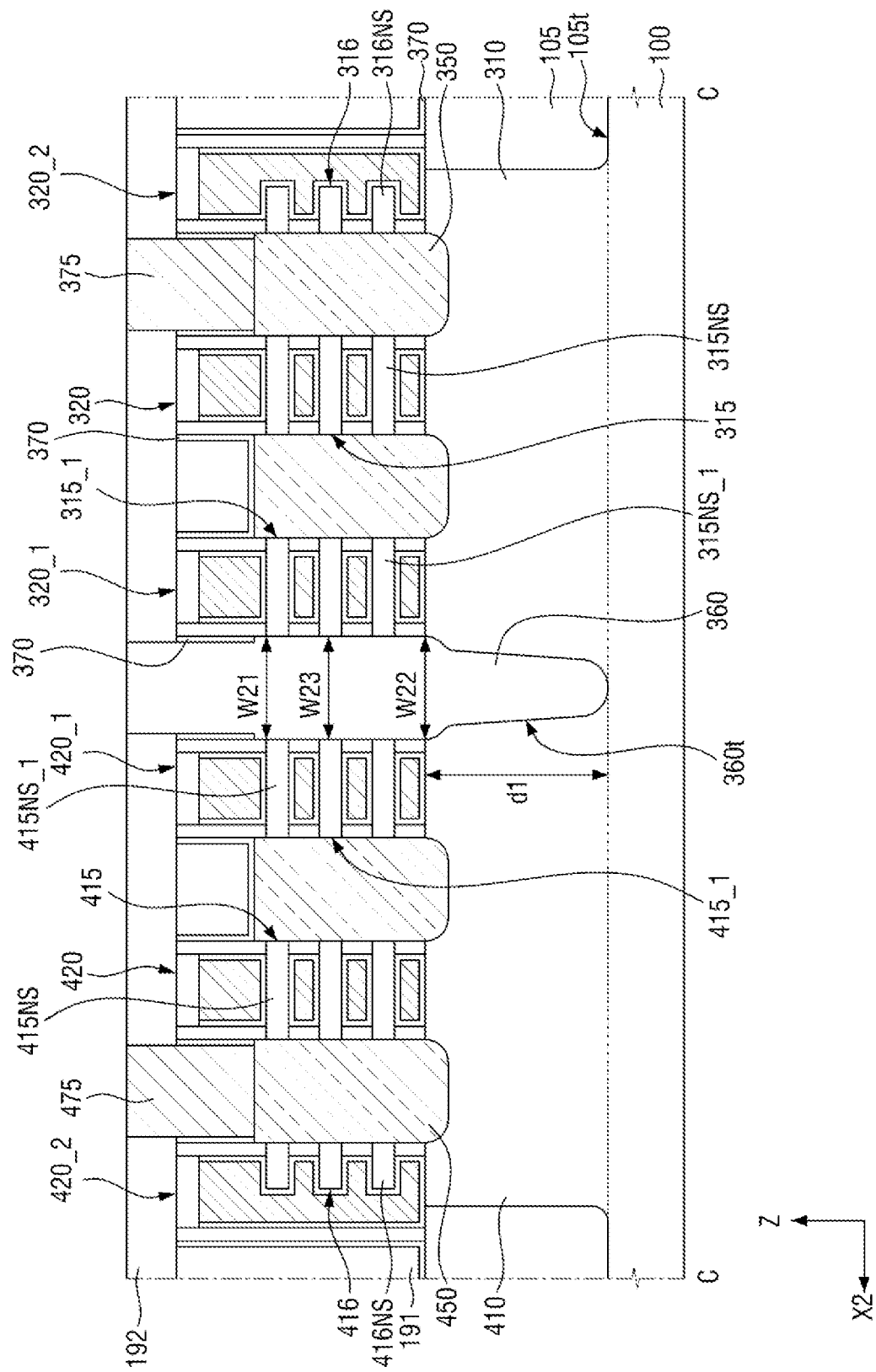
FIG. 16 illustrates a cross-sectional view taken along line C-C of FIG. 15.
Figure 17:
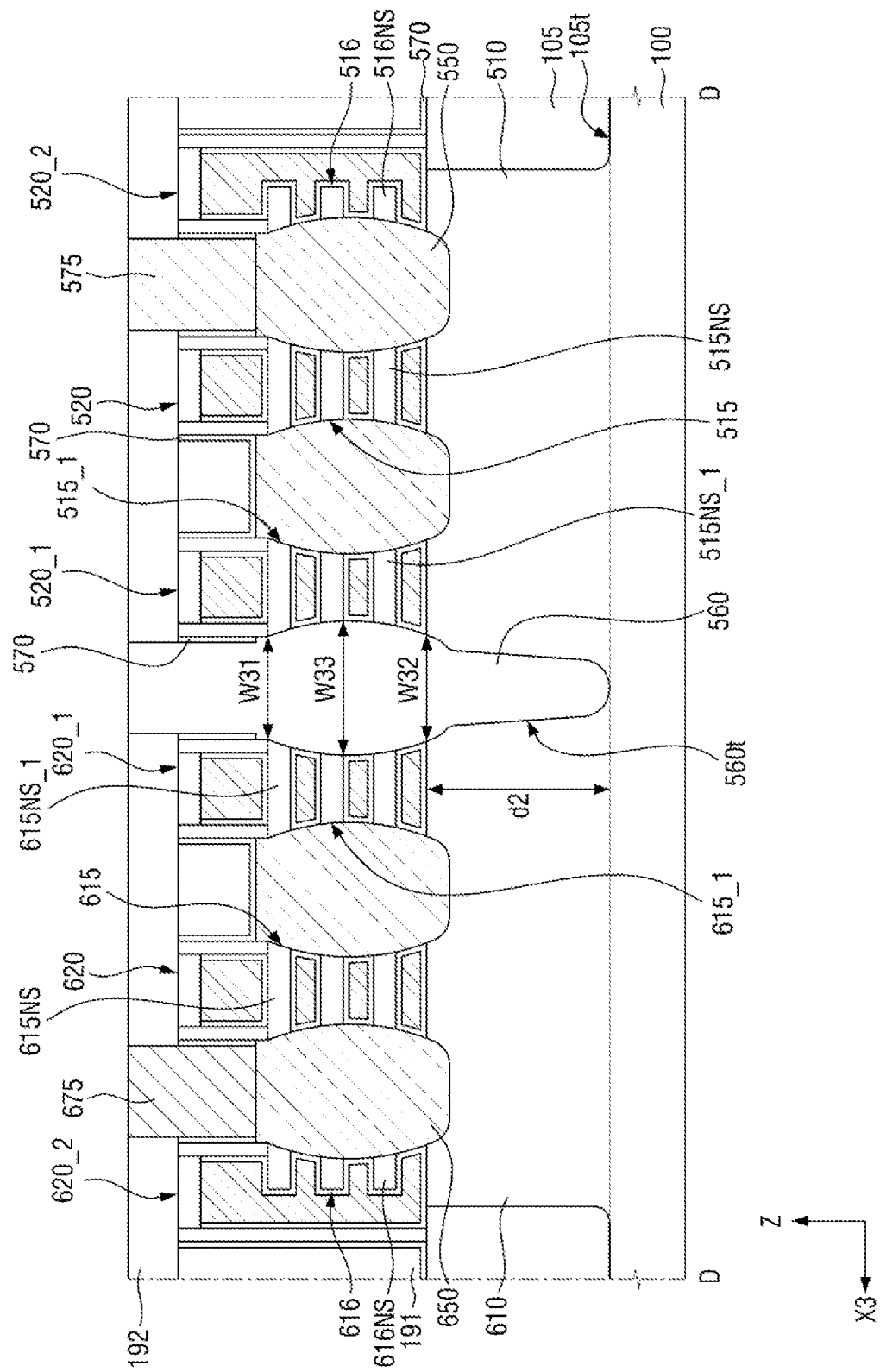
FIG. 17 illustrates a cross-sectional view taken along line D-D of FIG. 15.

FIG. 15 is a plan view illustrating a semiconductor device according to an example embodiment. FIG. 16 is a cross-sectional view taken along line C-C of FIG. 15. FIG. 17 is a cross-sectional view taken along line D-D of FIG. 15.

For convenience of explanation, in FIG. 15, the interlayer insulation layers 191 and 192 and contacts 375, 475, 575, and 675 are omitted. Unlike FIG. 2, in FIGS. 16 and 17, the wiring structure 180 and the third interlayer insulation layer 193 are omitted.

In FIGS. 15 to 17, third to sixth lower patterns 310, 410, 510, and 610, third to sixth active pattern stacks 315, 315_1, 415, 415_1, 515, 515_1, 615, and 615_1, third to sixth fin-cut pattern stacks 316, 416, 516, and 616, third to sixth gate structures 320, 320_1, 420, 420_1, 520, 520_1, 620, and 620_1, third to sixth fin-cut gate structures 320_2, 420_2, 520_2, and 620_2 may be similar to those as described with reference to FIGS. 1 to 14. A description of duplication with the previous embodiments will be briefly given.

Referring to FIGS. 15 to 17, a semiconductor device according to an example embodiment may include the third to sixth lower patterns 310, 410, 510, and 610, the third to sixth active pattern stacks 315, 315_, 415, 415_1, 515, 515_1, 615, and 615_1, the third to sixth fin-cut pattern stacks 316, 416, 516, and 616, the third to sixth gate structures 320, 320_1, 420, 420_1, 520, 520_1, 620, and 620_1, the third to sixth fin-cut gate structures 320_2, 420_2, 520_2, and 620_2, a second device isolation layer 360, and a third device isolation layer 560.

The substrate 100 may include a first region I and a second region II. The first region I and the second region II may include transistors of different conductivity types. For example, the first region I of the substrate 100 may be a region in which an NMOS transistor is formed, and the second region II of the substrate 100 may be a region in which a PMOS transistor is formed.

In the first region I of the substrate 100, the third and fourth lower patterns 310 and 410, the third and fourth active pattern stacks 315. 315_1, 415, and 415_1, the third and fourth fin-cut pattern stacks 316 and 416, the third and fourth gate structures 320, 320_1, 420, and 420_1, the third and fourth fin-cut gate structures 320_2 and 420_2, and the second device isolation layer 360 may be formed.

In the second region II of the substrate 100, the fifth to sixth lower patterns 510 and 610, the fifth and sixth active pattern stacks 515, 515_1, 615, and 615_1, the fifth and sixth fin-cut pattern stacks 516 and 616, the fifth and sixth gate structures 520, 520_1, 620, and 620_1, the fifth and sixth fin-cut gate structures 520_2 and 620_2, and the third device isolation layer 560 may be formed.

The third lower pattern 310 and the fourth lower pattern 410 may extend lengthwise along a third direction X2 parallel to the upper surface of the substrate 100. The third lower pattern 310 and the fourth lower pattern 410 may be arranged in a line in the third direction X2 that is a length direction thereof. The third lower pattern 310 and the fourth lower pattern 410 may be spaced apart from each other in the third direction X2.

The fifth lower pattern 510 and the sixth lower pattern 610 may extend lengthwise along a fifth direction X3 parallel to an upper surface of the substrate 100. The fifth lower pattern 510 and the sixth lower pattern 610 may be arranged in a line in the fifth direction X3 that is a length direction thereof. The fifth lower pattern 510 and the sixth lower pattern 610 may be spaced apart from each other in the fifth direction X3.

The field insulation layer 105 may be disposed on sidewalls of the third to sixth lower patterns 310, 410, 510, and 610.

The third active pattern stacks 315 and 315_1 and the third fin-cut pattern stack 316 may be disposed on the third lower pattern 310 and may be spaced apart from the third lower pattern 310 in the thickness direction Z of the substrate 100. The third active pattern stacks 315 and 315_1 and the third fin-cut pattern stack 316 may include one or more sheet patterns 315NS, 315NS_1, and 316NS, respectively, arranged in the thickness direction Z of the substrate 100. Each of the third active pattern stacks 315 and 315_1 may include a third normal pattern stack 315 and a third dummy pattern stack 315_1.

The fourth active pattern stacks 415 and 415_1 and the fourth fin-cut pattern stack 416 may be disposed on the fourth lower pattern 410 and may be spaced apart from the fourth lower pattern 410 in the thickness direction Z of the substrate 100. The fourth active pattern stacks 415 and 415_1 and the fourth fin-cut pattern stack 416 may include one or more sheet patterns 415NS, 415NS_1 and 416NS, respectively, arranged in the thickness direction Z of the substrate 100. Each of the fourth active pattern stacks 415 and 415_1 may include a fourth normal pattern stack 415 and a fourth dummy pattern stack 415_1.

The fifth active pattern stacks 515 and 515_1 and the fifth fin-cut pattern stack 516 may be disposed on the fifth lower pattern 510 and may be spaced apart from the fifth lower pattern 510 in the thickness direction Z of the substrate 100. The fifth active pattern stacks 515 and 515_1 and the fifth fin-cut pattern stack 516 may include one or more sheet patterns 515NS, 515NS_1 and 516NS, respectively, in the thickness direction Z of the substrate 100. Each of the fifth active pattern stacks 515 and 515_1 may include a fifth normal pattern stack 515 and a fifth dummy pattern stack 515_1.

The sixth active pattern stacks 615 and 615_1 and the sixth fin-cut pattern stack 616 may be disposed on the sixth lower pattern 610 and may be spaced apart from the sixth lower pattern 610 in the thickness direction Z of the substrate 100. The sixth active pattern stacks 615 and 615_1 and the sixth fin-cut pattern stack 616 may include one or more sheet patterns 615NS, 615NS_1 and 616NS, respectively, in the thickness direction Z of the substrate 100. Each of the sixth active pattern stacks 615 and 615_1 may include a sixth normal pattern stack 615 and a sixth dummy pattern stack 615_1.

The third gate structures 320 and 320_1 and the third fin-cut gate structure 320_2 may extend in a fourth direction Y2 crossing the third direction X2 and may cross the third lower pattern 310. The third fin-cut gate structure 320_2 may overlap a portion of the third lower pattern 310. The third gate structures 320 and 320_1 may overlap the third lower pattern 310.

The third gate structures 320 and 320_1 may cover the third active pattern stacks 315 and 315_1, respectively. Each of the third gate structures 320 and 320_1 may include a third normal gate structure 320 surrounding the third normal pattern stack 315 and a third dummy gate structure 320_1 surrounding the third dummy pattern stack 315_1. The third fin-cut gate structure 320_2 may surround the third fin-cut pattern stack 316.

The fourth gate structures 420 and 420_1 and the fourth fin-cut gate structure 420_2 may extend in the fourth direction Y2 and may cross the fourth lower pattern 410. The fourth fin-cut gate structure 420_2 may overlap a portion of the fourth lower pattern 410. The fourth gate structures 420 and 420_1 may overlap the fourth lower pattern 410.

The fourth gate structures 420 and 420_1 may cover the fourth active pattern stacks 415 and 415_1, respectively. Each of the fourth gate structures 420 and 420_1 may include a fourth normal gate structure 420 surrounding the fourth normal pattern stack 415 and a fourth dummy gate structure 420_1 surrounding the fourth dummy pattern stack 415_1. The fourth fin-cut gate structure 420_2 may surround the fourth fin-cut pattern stack 416.

The fifth gate structures 520 and 520_1 and the fifth fin-cut gate structure 520_2 may extend in a sixth direction Y3 crossing the fifth direction X3 and may cross the fifth lower pattern 510. The fifth fin-cut gate structure 520_2 may overlap a portion of the fifth lower pattern 510. The fifth gate structures 520 and 520_1 may overlap the fifth lower pattern 510.

The fifth gate structures 520 and 520_1 may cover the fifth active pattern stacks 515 and 515_1, respectively. Each of the fifth gate structures 520 and 520_1 may include a fifth normal gate structure 520 surrounding the fifth normal pattern stack 515 and a fifth dummy gate structure 520_1 surrounding the fifth dummy pattern stack 515_1. The fifth fin-cut gate structure 520_2 may surround the fifth fin-cut pattern stack 516.

The sixth gate structures 620 and 620_1 and the sixth fin-cut gate structure 620_2 may extend in the sixth direction Y3 and may cross the sixth lower pattern 610. The sixth fin-cut gate structure 620_2 may overlap a portion of the sixth lower pattern 610. The sixth gate structures 620 and 620_1 may overlap the sixth lower pattern 610.

The sixth gate structures 620 and 620_1 may cover the sixth active pattern stacks 615 and 615_1, respectively. The sixth gate structures 620 and 620_1 may include a sixth normal gate structure 620 surrounding the sixth normal pattern stack 615 and a sixth dummy gate structure 620_1 surrounding the sixth dummy pattern stack 615_1. The sixth fin-cut gate structure 620_2 may surround the sixth fin-cut pattern stack 616.

Each of the third and fourth gate structures 320, 320_1, 420, and 420_1 and the third and fourth fin-cut gate structures 320_2 and 420_2 may include an inner spacer (refer to 142 of FIG. 2). However, each of the fifth and sixth gate structures 520, 520_1, 620, and 620_1 and the fifth and sixth fin-cut gate structures 520_2 and 620_2 may not include an inner spacer.

A third epitaxial pattern 350 may be disposed between respective ones of the third gate structures 320 and 320_1 and the third fin-cut gate structure 320_2 that are adjacent to each other. The third epitaxial pattern 350 may be disposed on the third lower pattern 310.

A fourth epitaxial pattern 450 may be disposed between respective ones of the fourth gate structures 420 and 420_1 and the fourth fin-cut gate structure 420_2 that are adjacent to each other. The fourth epitaxial pattern 450 may be disposed on the fourth lower pattern 410.

A fifth epitaxial pattern 550 may be disposed between respective ones of the fifth gate structures 520 and 520_1 and the fifth fin-cut gate structure 520_2 that are adjacent to each other. The fifth epitaxial pattern 550 may be disposed on the fifth lower pattern 510.

A sixth epitaxial pattern 650 may be disposed between respective ones of the sixth gate structures 620 and 620_1 and the sixth fin-cut gate structure 620_2 that are adjacent to each other. The sixth epitaxial pattern 650 may be disposed on the sixth lower pattern 610.

A second etch stop layer 370 may be disposed on an upper surface of the third epitaxial pattern 350, an upper surface of the fourth epitaxial pattern 450, outer sidewalls of the third gate structures 320 and 320_1, an outer sidewall of the third fin-cut gate structure 320_2, outer sidewalls of the fourth gate structures 420 and 420_1, an outer sidewall of the fourth fin-cut gate structure 420_2, and an upper surface of the field insulation layer 105.

A third etch stop layer 570 may be disposed on an upper surface of the fifth epitaxial pattern 550, an upper surface of the sixth epitaxial pattern 650, outer sidewalls of the fifth gate structures 520 and 520_1, an outer sidewall of the fifth fin-cut gate structure 520_2, outer sidewalls of the sixth gate structures 620 and 620_1, an outer sidewall of the sixth fin-cut gate structure 620_2, and the upper surface of the field insulation layer 105.

The second device isolation layer 360 may separate the third lower pattern 310 and the fourth lower pattern 410. The second device isolation layer 360 may contact the third lower pattern 310 and the fourth lower pattern 410. The second device isolation layer 360 may be disposed between the third dummy gate structure 320_1 and the fourth dummy gate structure 420_1. The second device isolation layer 360 may extend along a sidewall of the third dummy gate structure 320_1 and a sidewall of the fourth dummy gate structure 420_1. The second device isolation layer 360 may fill a second device isolation trench 360t. The second device isolation layer 360 may not contact a gate insulation layer included in each of the third dummy gate structure 320_1 and the fourth dummy gate structure 420_1. The second device isolation layer 360 may contact an inner spacer included in each of the third dummy gate structure 320_1 and the fourth dummy gate structure 420_1.

The second device isolation layer 360 may have a fifth width W21 in the third direction X2 at an uppermost surface of the third dummy pattern stack 315_1. The second device isolation layer 360 may have a sixth width W22 in the third direction X2 at an upper surface of the third lower pattern 310.

The second device isolation layer 360 may include a first portion contacting the third lower pattern 310 and the fourth lower pattern 410, a second portion between the upper surface of the third lower pattern 310 and the uppermost surface of the third dummy pattern stack 315_1, and a third portion between the uppermost surface of the third dummy pattern stack 315_1 and an upper surface of the third dummy gate structure 320_1. The second portion of the second device isolation layer 360 may have a seventh width W23 in the third direction X2. Thus, the second device isolation layer 360 may have the seventh width W23 between the upper surface of the third lower pattern 310 and the uppermost surface of the third dummy pattern stack 315_1.

In an example embodiment, the fifth width W21 of the second device isolation layer 360 may be equal to the sixth width W22 of the second device isolation layer 360. The seventh width W23 of the second portion of the second device isolation layer 360 may be constant between the upper surface of the third lower pattern 310 and the uppermost surface of the third dummy pattern stack 315_1.

The third device isolation layer 560 may have an eighth width W31 in the fifth direction X3 at an uppermost surface of the fifth dummy pattern stack 515_1. The third device isolation layer 560 may have a ninth width W32 in the fifth direction X3 at the upper surface of the fifth lower pattern 510.

The third device isolation layer 560 may include a first portion contacting the fifth lower pattern 510 and the sixth lower pattern 610, a second portion between the upper surface of the fifth lower pattern 510 and the uppermost surface of the fifth dummy pattern stack 515_1, and a third portion between the uppermost surface of the fifth dummy pattern stack 515_1 and an upper surface of the fifth dummy gate structure 520_1. The second portion of the third device isolation layer 560 may have a tenth width W33 in the fifth direction X3. Thus, the third device isolation layer 560 may have the tenth width W33 between the upper surface of the fifth lower pattern 510 and the uppermost surface of the fifth dummy pattern stack 515_1.

In an example embodiment, the eighth width W31 of the third device isolation layer 560 may be equal to the ninth width W32 of the third device isolation layer 560. The tenth width W33 of the second portion of the third device isolation layer 560 may increase and then decrease in a direction away from the upper surface of the fifth lower pattern 510.

In an example embodiment, the ninth width W32 of the third device isolation layer 560 at the upper surface of the fifth lower pattern 510 may be equal to the sixth width W22 of the second device isolation layer 360 at the upper surface of the third lower pattern 310. The eighth width W31 of the third device isolation layer 560 at the uppermost surface of the fifth dummy pattern stack 515_1 may be equal to the fifth width W21 of the second device isolation layer 360 at the uppermost surface of the third dummy pattern stack 315_1.

Since the tenth width W33 of the second portion of the third device isolation layer 560 increases in the direction away from the upper surface of the fifth lower pattern 510, the tenth width W33 of the second portion of the third device isolation layer 560 may be greater than the seventh width W23 of the second portion of the second device isolation layer 360.

In an example embodiment, a depth d1 of the first portion of the second device isolation layer 360 contacting the third lower pattern 310 may be equal to a depth d2 of the first portion of the third device isolation layer 560 contacting the fifth lower pattern 510.

The third contact 375 and the fourth contact 475 may be disposed in the second interlayer insulation layer 192 and the first interlayer insulation layer 191. The third contact 375 may be connected to the third epitaxial pattern 350 on the third lower pattern 310. The fourth contact 475 may be connected to the fourth epitaxial pattern 450 on the fourth lower pattern 410.

The fifth contact 575 and the sixth contact 675 may be disposed in the second interlayer insulation layer 192 and the first interlayer insulation layer 191. The fifth contact 575 may be connected to the fifth epitaxial pattern 550 on the fifth lower pattern 510. The sixth contact 675 may be connected to the sixth epitaxial pattern 650 on the sixth lower pattern 610.

Figure 18:
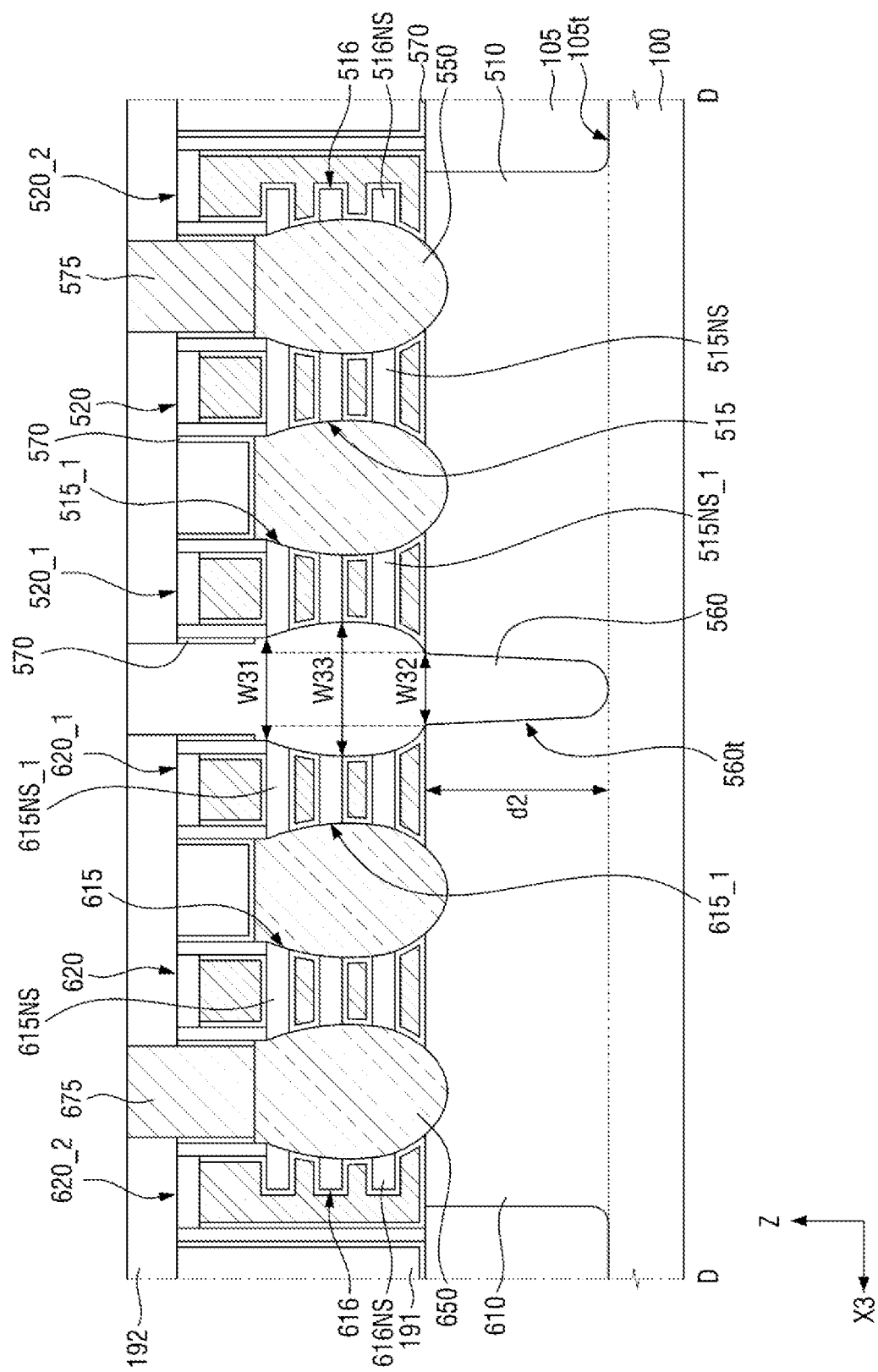
FIG. 18 illustrates a view of a semiconductor device according to an example embodiment.

FIG. 18 is a view illustrating a semiconductor device according to an example embodiment. The same elements as described with reference to FIGS. 15 to 17 will not be described again or will be briefly mentioned.

Referring to FIG. 18, in a semiconductor device according to an example embodiment, the ninth width W32 of the third device isolation layer 560 at an upper surface of the fifth lower pattern 510 may be smaller than the sixth width W22 of the second device isolation layer 360 at an upper surface of the third lower pattern 310 as shown in FIG. 16.

In addition, the eighth width W31 of the third device isolation layer 560 at the uppermost surface of the fifth dummy pattern stack 515_1 may be greater than the ninth width W32 of the third device isolation layer 560 at the upper surface of the fifth lower pattern 510.

Figure 19:
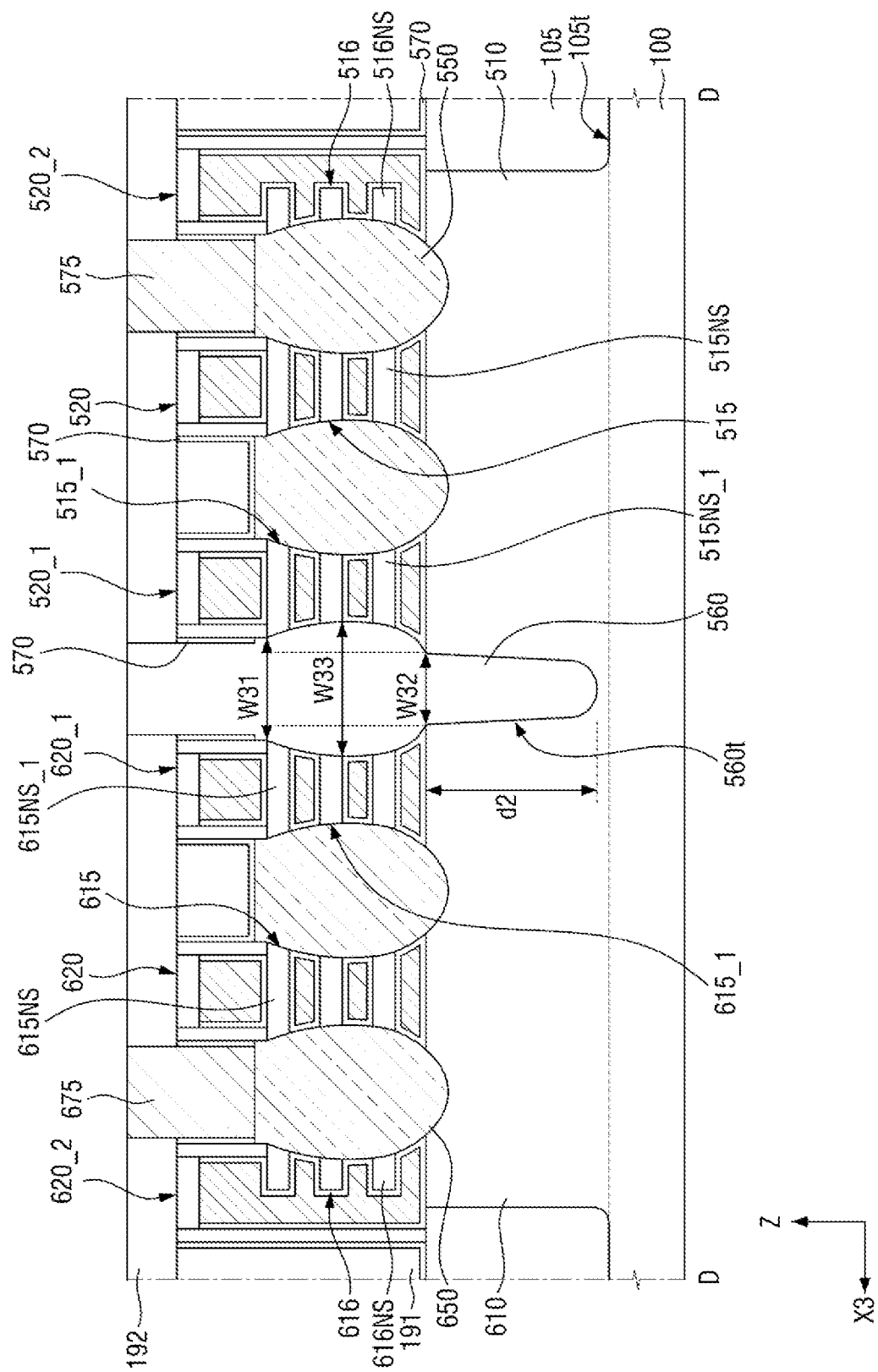
FIG. 19 illustrates a view of a semiconductor device according to an example embodiment.

FIG. 19 is a view illustrating a semiconductor device according to an example embodiment. The same elements as described with reference to FIGS. 15 to 17 will not be described again or will be briefly mentioned.

Referring to FIG. 19, in a semiconductor device according to an example embodiment, the depth d1 of the first portion of the second device isolation layer 360 contacting the third lower pattern 310 may be greater than the depth d2 of the first portion of the third device isolation layer 560 contacting the fifth lower pattern 510.

Figure 20:
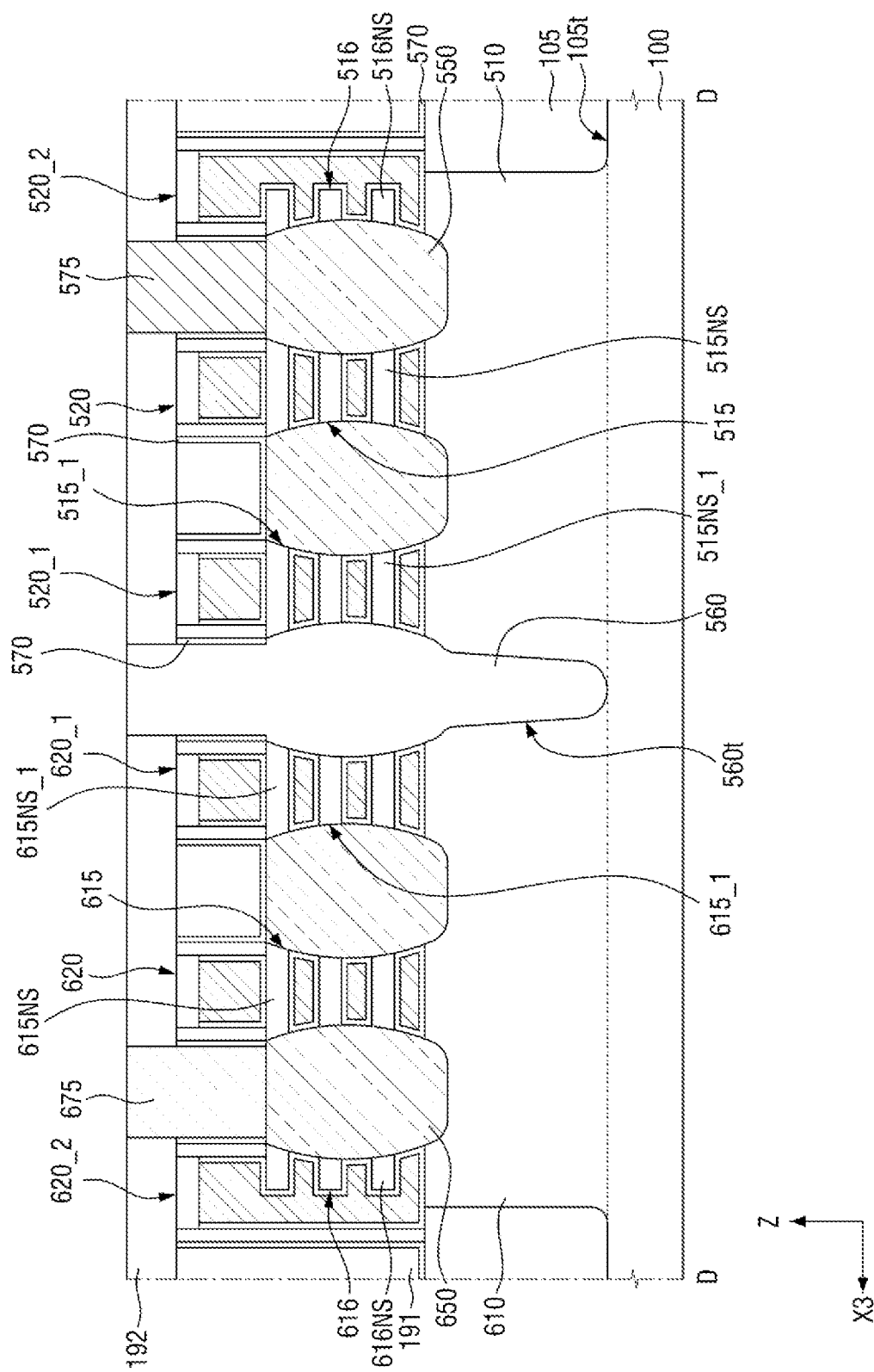
FIG. 20 illustrates a view of a semiconductor device according to an example embodiment.

FIG. 20 is a view illustrating a semiconductor device according to an example embodiment. The same elements as described with reference to FIGS. 15 to 17 will not be described again or will be briefly mentioned.

Referring to FIG. 20, in a semiconductor device according to an example embodiment, an upper surface of the third epitaxial pattern 350 and an upper surface of the fourth epitaxial pattern 450 may be higher than upper surfaces of uppermost sheets of respective ones of the plurality of sheet patterns 315NS, 315NS_1, 316NS, 415NS, 415NS_1, and 416NS, with respect to an upper surface of the third lower pattern 310 and an upper surface of the fourth lower pattern 410.

An upper surface of the fifth epitaxial pattern 550 and an upper surface of the sixth epitaxial pattern 650 may be located at the same level as upper surfaces of uppermost sheets of respective ones of the plurality of sheet patterns 515NS, 515NS_1, 516NS, 615NS, 615NS_1, and 616NS, with respect to an upper surface of the fifth lower pattern 510 and an upper surface of the sixth lower pattern 610.

As described above, embodiments relate to a semiconductor device including a MBCFET (Multi-Bridge Channel Effect Transistor).

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate;
a first lower pattern and a second lower pattern on the substrate and arranged in a line in a first direction;
a first active pattern stack disposed on and spaced apart from the first lower pattern;
a second active pattern stack disposed on and spaced apart from the second lower pattern;
a field insulation layer disposed on a sidewall of the first lower pattern and a sidewall of the second lower pattern;
a fin-cut gate structure disposed on the first lower pattern and overlapping a portion of the first lower pattern;
a first gate structure surrounding the first active pattern stack and extending in a second direction crossing the first direction;
a second gate structure surrounding the second active pattern stack and extending in the second direction; and
a device isolation layer between the first gate structure and the second gate structure, and separating the first lower pattern and the second lower pattern, and directly contacting the first lower pattern and the second lower pattern,
wherein the first gate structure includes a gate electrode and a gate insulation layer,
wherein a height from an upper surface of the first lower pattern to an upper surface of the device isolation layer is greater than a height from the upper surface of the first lower pattern to an upper surface of the gate electrode, and
wherein an upper surface of the field insulation layer is higher than a lowermost part of the device isolation layer.

2. The semiconductor device of claim 1, wherein:
the device isolation layer has a first width in the first direction at an uppermost surface of the first active pattern stack,
the device isolation layer has a second width in the first direction at the upper surface of the first lower pattern, and
the first width is equal to the second width.

3. The semiconductor device of claim 1, wherein a width of a first portion of the device isolation layer in the first direction increases as a distance increases from the substrate, the first portion of the device isolation layer contacting the first lower pattern and the second lower pattern.

4. The semiconductor device of claim 1, wherein a width of a second portion of the device isolation layer in the first direction is constant, the second portion of the device isolation layer being between the upper surface of the first lower pattern and an uppermost surface of the first active pattern stack.

5. The semiconductor device of claim 1, wherein a width of a second portion of the device isolation layer increases and then decreases in a direction away from the upper surface of the first lower pattern, the second portion of the device isolation layer being between the upper surface of the first lower pattern and an uppermost surface of the first active pattern stack.

6. The semiconductor device of claim 1, wherein:
the device isolation layer has a first width in the first direction at an uppermost surface of the first active pattern stack,
the device isolation layer has a second width in the first direction at the upper surface of the first lower pattern, and
the first width is greater than the second width.

7. The semiconductor device of claim 1, wherein the device isolation layer includes:
a third portion between an uppermost surface of the first active pattern stack and an upper surface of the first gate structure, the third portion having a third width in the first direction; and
a fourth portion on the third portion of the device isolation layer, the fourth portion having a fourth width in the first direction that is less than the third width.

8. The semiconductor device of claim 1, wherein the gate insulation layer is in contact with the device isolation layer.

9. The semiconductor device of claim 1, further comprising:
- an epitaxial pattern on the first lower pattern;
- a first interlayer insulation layer on an upper surface of the first gate structure and an upper surface of the second gate structure;
- a contact in the first interlayer insulation layer and connected to the epitaxial pattern;
- a second interlayer insulation layer on the first interlayer insulation layer and the contact; and
- a wiring structure in the second interlayer insulation layer and connected to the contact,
- wherein the height from the upper surface of the first lower pattern to the upper surface of the device isolation layer is equal to or less than a height from the upper surface of the first lower pattern to an upper surface of the contact.

10. The semiconductor device of claim 1, wherein the first active pattern stack includes a plurality of sheets stacked on the first lower pattern and/or the second lower pattern.

11. A semiconductor device, comprising:
- a substrate;
- a first lower pattern disposed on the substrate and extending in a first direction parallel to an upper surface of the substrate;
- a second lower pattern disposed on the substrate and extending in the first direction;
- a plurality of first sheet patterns disposed on the first lower pattern and arranged in a second direction that is perpendicular to the upper surface of the substrate;
- a first gate electrode surrounding the plurality of first sheet patterns;
- a plurality of second sheet patterns disposed on the second lower pattern and arranged in the second direction;
- a second gate electrode surrounding the plurality of second sheet patterns; and
- an insulation pattern separating the first lower pattern and the second lower pattern, and directly contacting the plurality of first sheet patterns and the plurality of second sheet patterns, the insulation pattern including a linear insulation pattern and a plurality of protruding insulation patterns,
- wherein the linear insulation pattern extends in the second direction from a level that is higher than an uppermost height of the first and second gate electrodes to a level that is lower than an uppermost surface of the first and second lower patterns, and
- wherein each of the plurality of protruding insulation patterns protrudes in the first direction from a sidewall of the linear insulation pattern.

12. The semiconductor device of claim 11, wherein:
- the linear insulation pattern contacts the first lower pattern and the second lower pattern, and
- the plurality of protruding insulation patterns are disposed over an upper surface of the first lower pattern.

13. The semiconductor device of claim 11, wherein each of the plurality of protruding insulation patterns includes an outer protruding insulation layer and an inner protruding insulation layer between the linear insulation pattern and the outer protruding insulation layer.

14. The semiconductor device of claim 13, wherein the inner protruding insulation layer includes an air gap.

15. A semiconductor device, comprising:
- a substrate including a first region and a second region;
- a first lower pattern in the first region and extending in a first direction;
- a second lower pattern in the second region and extending in a second direction;
- a first active pattern stack on the first lower pattern, the first active pattern stack including a plurality of first sheet patterns;
- a second active pattern stack on the second lower pattern, the second active pattern stack including a plurality of second sheet patterns;
- a first gate structure surrounding the plurality of first sheet patterns;
- a second gate structure surrounding the plurality of second sheet patterns;
- a first device isolation layer extending along a sidewall of the first gate structure and contacting the first lower pattern; and
- a second device isolation layer extending along a sidewall of the second gate structure and contacting the second lower pattern,
- wherein:
- the first device isolation layer includes a first portion between an upper surface of the first lower pattern and an uppermost surface of the first active pattern stack,
- the second device isolation layer includes a second portion between an upper surface of the second lower pattern and an uppermost surface of the second active pattern,
- the first portion of the first device isolation layer has a first width in the first direction, and
- the second portion of the second device isolation layer has a second width in the second direction greater than the first width.

16. The semiconductor device of claim 15, wherein a width of the first device isolation layer in the first direction at the upper surface of the first lower pattern is equal to or greater than a width of the second device isolation layer at the upper surface of the second lower pattern.

17. The semiconductor device of claim 15, wherein a depth of a portion of the first device isolation layer contacting the first lower pattern is equal to or greater than a depth of a portion of the second device isolation layer contacting the second lower pattern.

18. The semiconductor device of claim 15, wherein the first gate structure contacts the first device isolation layer and includes an inner spacer protruding in the first direction.

19. The semiconductor device of claim 15, wherein the second width increases and then decreases in a direction away from the upper surface of the second lower pattern.

20. The semiconductor device of claim 15, wherein the plurality of first sheet patterns is included in an NMOS region, and the plurality of second sheet patterns is included in a PMOS region.

* * * * *